United States Patent
Lin et al.

(10) Patent No.: US 12,356,629 B2
(45) Date of Patent: *Jul. 8, 2025

(54) SEMICONDUCTOR MEMORY DEVICES AND METHODS OF MANUFACTURING THEREOF

(71) Applicant: Taiwan Semiconductor Manufacturing Company, Ltd., Hsinchu (TW)

(72) Inventors: Meng-Han Lin, New Taipei (TW); Chia-En Huang, Hsinchu (TW)

(73) Assignee: Taiwan Semiconductor Manufacturing Company, Ltd., Hsinchu (TW)

(*) Notice: Subject to any disclaimer, the term of this patent is extended or adjusted under 35 U.S.C. 154(b) by 114 days.

This patent is subject to a terminal disclaimer.

(21) Appl. No.: 18/325,766

(22) Filed: May 30, 2023

(65) Prior Publication Data

US 2023/0309316 A1 Sep. 28, 2023

Related U.S. Application Data

(63) Continuation of application No. 17/232,734, filed on Apr. 16, 2021, now Pat. No. 11,696,449.

(51) Int. Cl.
*H10B 51/30* (2023.01)
*H10B 51/20* (2023.01)
(Continued)

(52) U.S. Cl.
CPC .......... *H10B 51/30* (2023.02); *H10B 51/20* (2023.02); *H10B 51/40* (2023.02); *H10B 51/50* (2023.02)

(58) Field of Classification Search
CPC ........ H10B 43/10; H10B 43/20; H10B 43/30; H10B 43/40; H10B 43/50; H10B 51/10;
(Continued)

(56) References Cited

U.S. PATENT DOCUMENTS 9,449,987 B1   9/2016  Miyata et al.
11,696,449 B2 * 7/2023  Lin .................. H10B 51/20
                                                          257/295
(Continued)

FOREIGN PATENT DOCUMENTS

CN    113517299 A  * 10/2021  ............. G11C 11/14
CN    113675215 A  * 11/2021  ............... G11C 8/14
(Continued)

OTHER PUBLICATIONS

Office Action issued in connection with Taiwan Appl. No. 110121775 dated Oct. 15, 2024.
(Continued)

*Primary Examiner* — Matthew E Warren
(74) *Attorney, Agent, or Firm* — FOLEY & LARDNER LLP

(57) ABSTRACT

A semiconductor die comprises a device portion comprising: an array of active memory devices extending in a first direction, and interface portions located adjacent to axial ends of the device portion in the first direction. The interface portions have a staircase profile in a vertical direction and comprise an array of dummy memory devices and an array of gate vias. The dummy memory devices are axially aligned with the active memory devices in the first direction, each dummy memory device comprising at least one interface via. Moreover, each row of the array of gate vias extends in the first direction and is located parallel to a row of the array of dummy memory devices in a second direction perpendicular to the first direction. Each gate via is electrically coupled to the at least one interface via of a dummy memory device located adjacent thereto.

20 Claims, 20 Drawing Sheets

(51) Int. Cl.
*H10B 51/40* (2023.01)
*H10B 51/50* (2023.01)

(58) Field of Classification Search
CPC ........ H10B 51/20; H10B 51/30; H10B 51/40; H10B 51/50
See application file for complete search history.

(56) References Cited

U.S. PATENT DOCUMENTS

| | | | |
|---|---|---|---|
| 2015/0372101 A1 | 12/2015 | Lee et al. | |
| 2016/0268287 A1* | 9/2016 | Park | H10B 43/10 |
| 2019/0333929 A1 | 10/2019 | Lee | |
| 2020/0357814 A1 | 11/2020 | Kim et al. | |
| 2020/0403005 A1 | 12/2020 | Sakurai et al. | |
| 2021/0125928 A1* | 4/2021 | Kim | H01L 21/76877 |
| 2021/0242231 A1 | 8/2021 | Kim et al. | |
| 2021/0313246 A1 | 10/2021 | Matsumura et al. | |
| 2021/0335804 A1* | 10/2021 | Yeh | H10B 43/10 |
| 2021/0384124 A1* | 12/2021 | Wang | H10B 41/27 |
| 2021/0399015 A1* | 12/2021 | Lin | H10B 51/50 |
| 2022/0068957 A1* | 3/2022 | Yeh | H01L 23/5226 |
| 2022/0199134 A1* | 6/2022 | Cheng | H10B 41/27 |
| 2022/0230976 A1* | 7/2022 | Lin | H01L 24/80 |
| 2022/0231050 A1* | 7/2022 | Young | G11C 11/223 |
| 2022/0293622 A1 | 9/2022 | Kim et al. | |
| 2022/0320017 A1* | 10/2022 | Lin | H01L 23/564 |
| 2022/0320141 A1* | 10/2022 | Lin | H10B 51/50 |

FOREIGN PATENT DOCUMENTS

| | | | | |
|---|---|---|---|---|
| KR | 20210052934 | | 5/2021 | |
| KR | 20210052934 A | * | 5/2021 | ............ H10B 43/40 |

OTHER PUBLICATIONS

Notice of Allowance on U.S. Appl. No. 17/232,734 DTD Feb. 17, 2023.

* cited by examiner

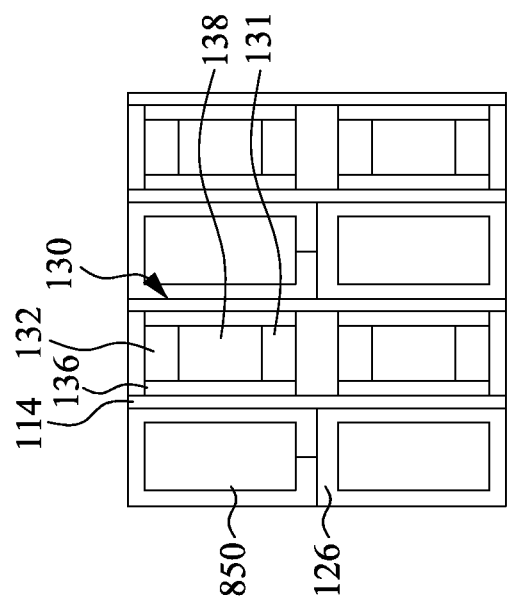
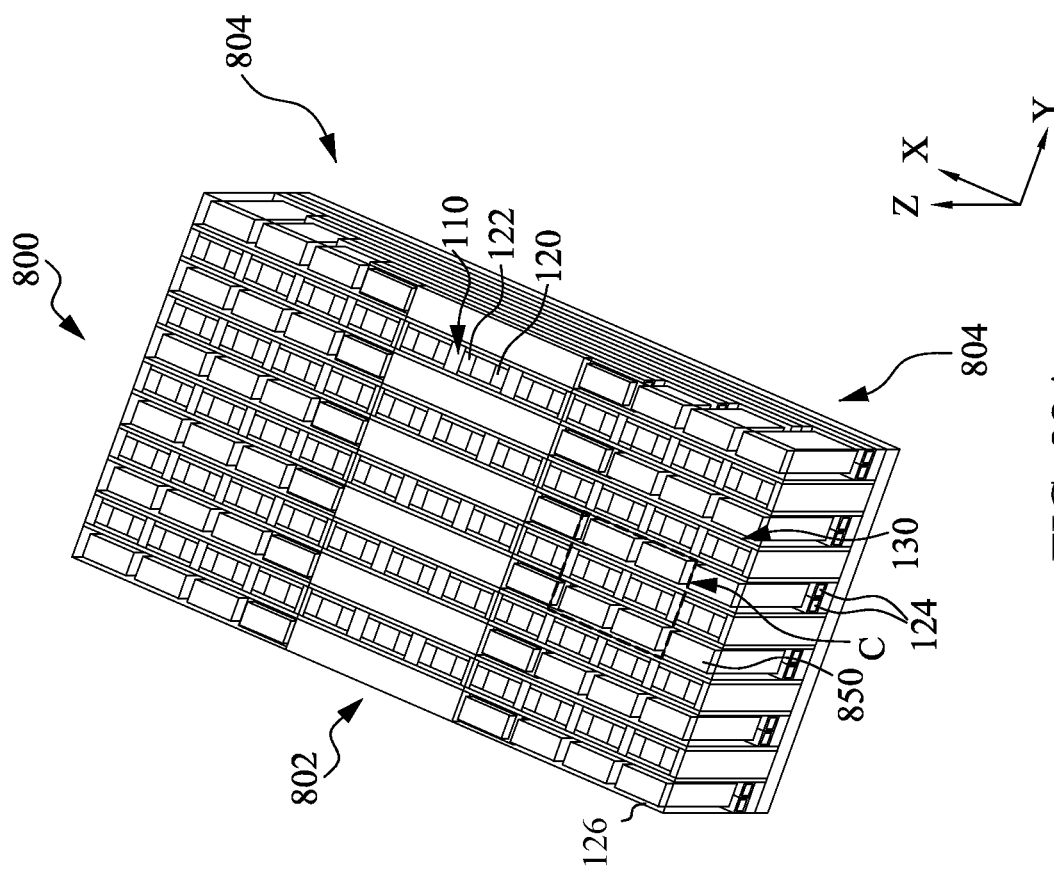
FIG. 32B
FIG. 32A

SEMICONDUCTOR MEMORY DEVICES AND METHODS OF MANUFACTURING THEREOF

CROSS-REFERENCE TO RELATED APPLICATION

This application is a Continuation of U.S. patent application Ser. No. 17/232,734, filed Apr. 16, 2021, the entire disclosure of which is incorporated herein by reference for all purposes.

BACKGROUND

The present disclosure generally relates to semiconductor devices, and particularly to methods of making a 3-dimensional (3D) memory device.

The semiconductor industry has experienced rapid growth due to continuous improvements in the integration density of a variety of electronic components (e.g., transistors, diodes, resistors, capacitors, etc.). For the most part, this improvement in integration density has come from repeated reductions in minimum feature size, which allows more components to be integrated into a given area.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 32A is a top, perspective view of a semiconductor die including a device portion that includes an array of active memory devices, and interface portions that include an array of dummy memory devices, according to another embodiment; FIG. 32B is a top view of a portion of the semiconductor die of FIG. 32A indicated by the arrow C in FIG. 32A.

DETAILED DESCRIPTION

Figure 1:
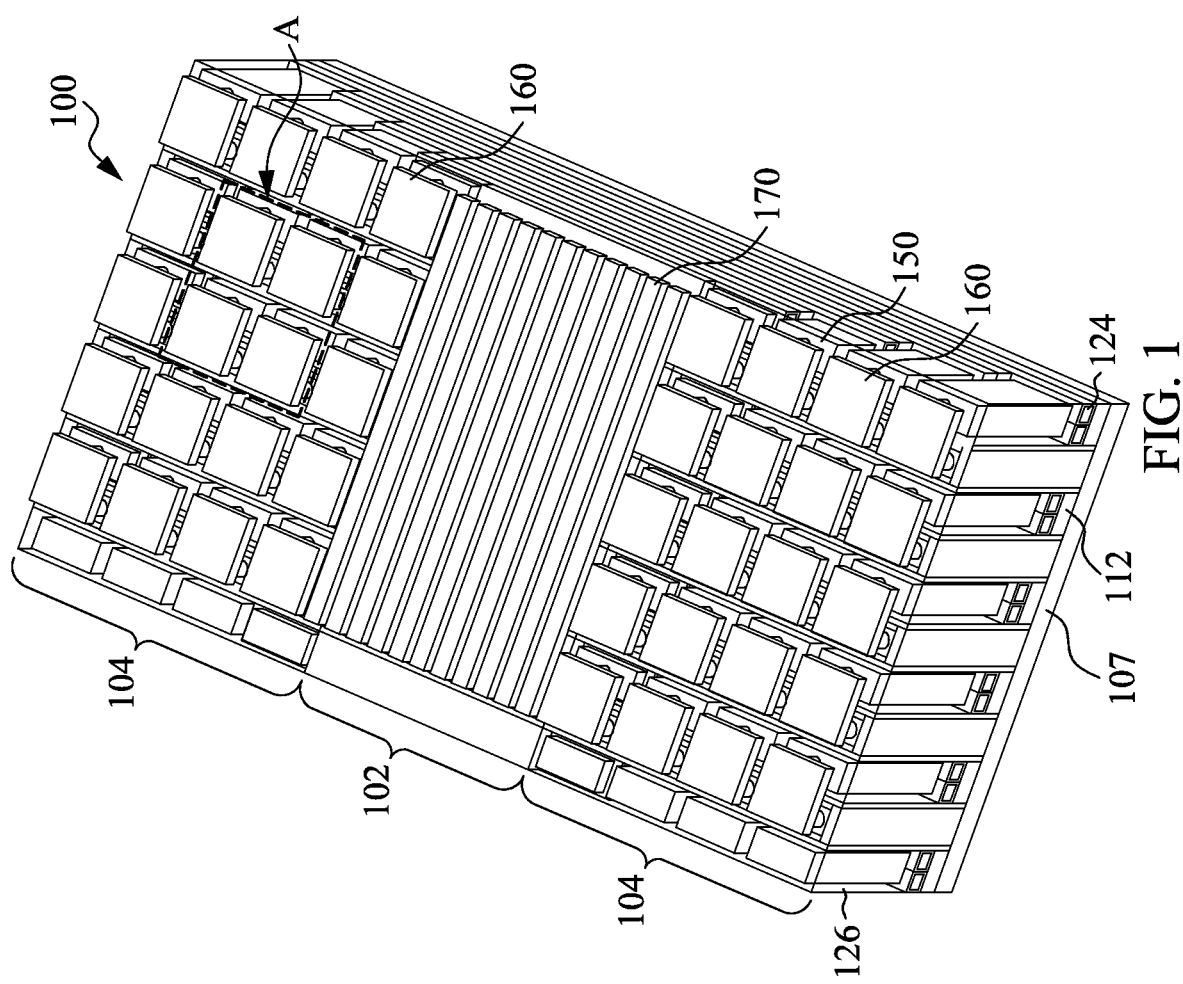
FIG. 1 is a top, perspective view of a semiconductor die including a device portion that includes an array of active memory devices, and interface portions that include an array of dummy memory devices, according to an embodiment.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over, or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" "top," "bottom" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In general, 3D memories include an array of memory devices formed in a stack of insulating layers and gate layers, and may include a double gate or plurality of gate layers. Such double gate structures can provide a higher etching aspect ratio. During fabrication, the die including an array of memory devices is formed such that an interface portion is formed on either side of the array of memory devices to allow electrical interface with the memory devices included in the array. Such an interface portion may have a staircase profile. Interface vias that are configured to be coupled to external devices, and gate vias that are electrically coupled to the one or more gate layers are generally formed in the interface portions after the memory devices have been formed in a device portion located between the interface portions. This adds additional fabrications steps, for example, use of an additional mask and photolithography, etching, and/or depositions steps, which increases fabrication complexity and cost.

Embodiments of the present disclosure are discussed in the context of forming a semiconductor die, and particularly in the context of forming 3D memory device, that are formed in a stack of insulating and gate layers. For example, the present disclosure provides semiconductor dies which include a device portion including an array of active memory devices and at least one interface portion adjacent to the device portion. The at least one interface portion has a staircase profile. The at least one interface portion includes an array of dummy memory devices that are formed simultaneously with the active memory devices (e.g., during the same fabrication process and/or using the same masks). The dummy memory devices include source and/or drain like structures that serve as the interface vias which are coupled to gate vias. Thus, the fabrication step of forming interface vias subsequent to forming the active memory devices is obviated, thereby reducing fabrication complexity and cost. In some embodiments, the gate vias can also be formed simultaneously with forming the interface vias of the dummy memory devices, and may be formed from the same material as the interface vias. This further reduces fabrication steps, and thereby, reduces fabrication complexity and cost.

Figure 3:
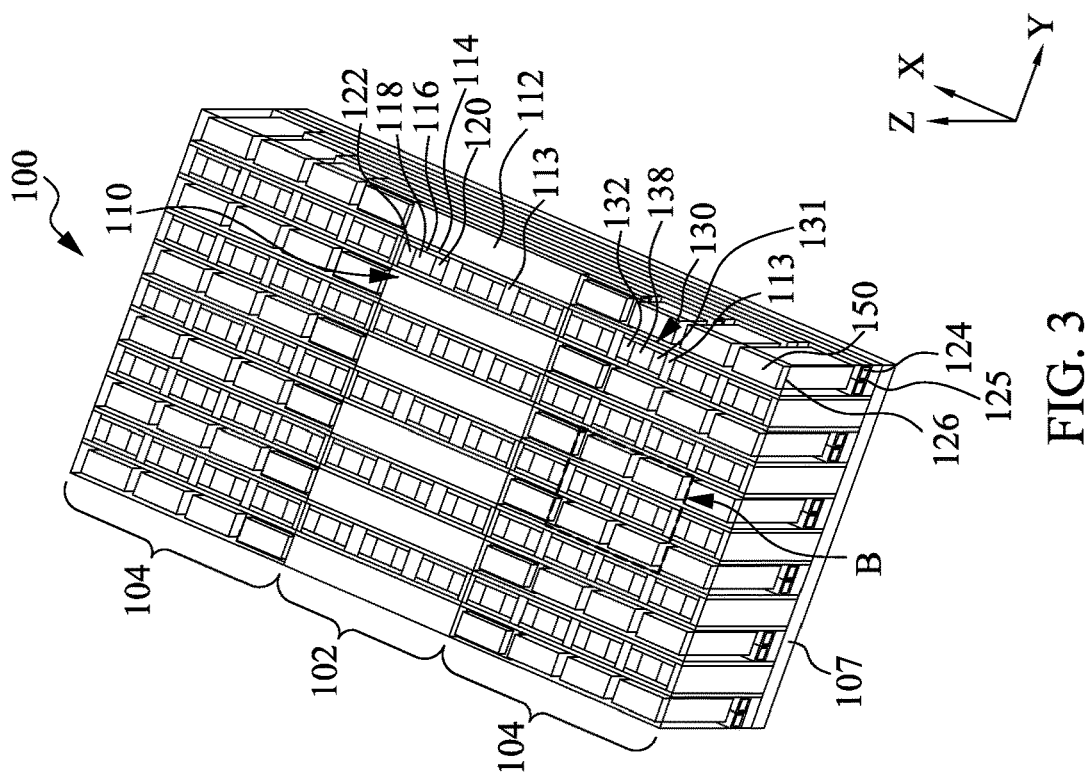
FIG. 3 is a top, perspective view of the semiconductor die of FIG. 1 with through via caps of the dummy memory devices, and driver lines of the active memory devices removed.

FIGS. 1 and 3 show top perspective views a semiconductor die 100, according to an embodiment. The semiconductor die 100 includes a device portion 102 including an array of active memory devices 110, and a set of interface portions 104 located adjacent to axial ends of the device portion 102 in a first direction, for example, the X-direction. The device portion 102 and the interface portion 104 may be disposed on a substrate 107 (e.g., a silicon, or silicon on insulator (SOI) substrate). Each row of the array of the active memory devices 110 extends in the first direction, for example, the X-direction. Each active memory device 110 is separated and electrically isolated from an adjacent active memory devices 110 within a row by an inner spacer 113, which may be formed from an electrically insulating material [e.g., silicon oxide (SiO$_2$)]. The interface portions 104 have a staircase profile in a vertical direction (e.g., the Z-direction). Moreover, the interface portions 104 include an array of dummy memory devices 130. Each row of the array of dummy memory devices 130 is axially aligned with a corresponding row of the array of active memory devices 110 in the first direction (e.g., the X-direction).

Figure 4A:
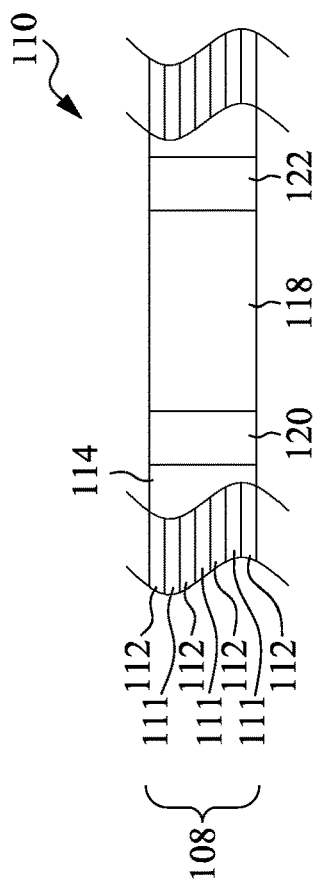
FIG. 4A is a schematic illustration of a side cross-section of an active memory device.

Referring to FIGS. 3 and 4A, the memory device 110 includes a source 120, and a drain 122 separated from the source 120 in the first direction or the X-direction by an inner spacer 118. The source 120 and drain 122 may include a conducting material (e.g., a n or p-doped semiconductor such as Si, SiGe, etc.), and may be formed using a deposition process, an epitaxial growth process, or any other suitable process.

The inner spacer 118 extends between the source 120 and the drain 122. The inner spacer 118 may be formed from an electrically insulating material, for example, silicon nitride (SiN), silicon oxide (SiO), silicon carbide nitride (SiCN), silicon oxycarbonitride (SiOCN), silicon oxynitride (SiON), etc.

A channel layer 116 is disposed on radially outer surfaces of the source 120, the drain 122, and the inner spacer 118. The radially outer surfaces of the channel layer 116 extend in the first direction, for example, the X-direction. In some embodiments, the channel layer 116 may be formed from a semiconductor material, for example, Si (e.g., polysilicon or amorphous silicon), Ge, SiGe, silicon carbide (SiC), etc.

A memory layer 114 is disposed on a radially outer surface of the channel layer 116, and extends in the first direction. In some embodiments, the memory layer 114 may include a ferroelectric material, for example, lead zirconate titanate (PZT), PbZr/TiO$_3$, BaTiO$_3$, PbTiO$_2$, etc. The memory layer 114 extends from the device portion 102 to each of the interface portions 104 along the respective row of active memory devices 110 (i.e., in the first direction) such that the memory layer 114 is continuous from the device portion 102 to the interface portions 104, as shown in FIGS. 3 and 4A.

The device portion 102 also includes a stack 108 disposed on outer surfaces of the memory layer 114, such that the stack 108 is interposed between adjacent rows of active memory devices 110. As shown in FIG. 4A, the stack 108 includes a plurality of insulating layers 112 and a plurality of gate layers 124 alternately stacked on top of one another in the vertical direction or the Z-direction. In some embodiments, a topmost layer and a bottommost layer of the stack 108 may include an insulating layer 112 of the plurality of insulating layers 112. The bottommost insulating layer 112 may be disposed on the substrate 107. The insulating layer 112 may include silicon oxide (SiO), or any other electric. Moreover, the gate layer 124 may be formed from a conductive material such as a metal, for example, tungsten (W), copper (Cu), cobalt (Co), etc., or a high-k dielectric material, for example, hafnium oxide (HfO), tantalum nitride (TaN), etc.

Two parallel gate layers 124 may be located adjacent to each other in a second direction that is perpendicular to the first direction and in the same plane (e.g., the Y-direction), and may be interposed between two vertically separated insulating layers 112 within the device portion. Each gate layer 124 of the two parallel gate layers 124 may be associated with a separate active memory device 110, for example, each associated with an active memory device 110 located in rows of the active memory devices 110 that are parallel to each other. In some embodiments, an adhesive layer (e.g., the adhesive layer 125 shown in FIG. 5) may be interposed between the gate layer/s 124 and the adjacent insulating layers 112, and facilitate adhesion of the gate layer 124 to the insulating layer 112, and may also serve as a spacer between two parallel gate layers 124 that are interposed between the same vertically separated insulating layers 112. In some embodiments, the adhesion layer (e.g., the adhesive layer 125) may include e.g., titanium (Ti), chromium (Cr), or any other suitable adhesive material.

Each of the plurality of gate layers 124 extend from the device portion 102 to the interface portions 104 along the respective row of active memory devices 110, each of the plurality of gate layers 124 being continuous from the device portion 102 to the interface portions 104. Moreover, the insulating layers 112 may also extend from device portion 102 to the interface portions 104. The insulating layers 112 and the gate layers 124 have a length such that a bottommost first pair of an insulating layer 112 and a gate layer 124 has a longer length than a subsequent second pair of an insulating layer 112 and a gate layer 124 disposed immediately above the lower most pair in the Z-direction. Similarly, a subsequent third pair of an insulating layer 112 and a gate layer 124 disposed above the second pair in the Z-direction has a shorter length than the second pair such that each subsequent pair has a shorter length than an immediately preceding pair disposed below it.

The topmost layer in the stack 108 may be an insulating layer 112 that has a shorter length than the gate layer/s 124 disposed immediately below it, and the interface portions are formed by the portion of the subsequent layers disposed below the topmost insulating layer 112. The step wise increase in length of the subsequent pairs of the insulating layer 112 and the gate layer 124 from the topmost insulating layer 112 to the bottommost insulating layer 112 causes the interface portions 104 to have a staircase or step profile in the vertical or Z-direction with a portion of the gate layer 124 in each pair forming a top exposed layer of each step in the interface portions 104. The interface portions 104 provide an electrical connection interface allowing a controller or driver to be electrically coupled to the gate layer 124. Activating the gate layer 124 by applying a voltage to it may cause current to flow from the source 120 to the drain 122. Moreover, driver lines 170 may be coupled to the source 120 and the drain 122 of the active memory devices 110, and may provide electric charge to the source 120 and the drain 122. In some embodiments, a single driver line 170 may be coupled to a set of sources 120 or a set of drains 122 of a plurality of active memory devices 110, which are located parallel to each other in the second direction (e.g., the Y-direction).

Figure 4B:
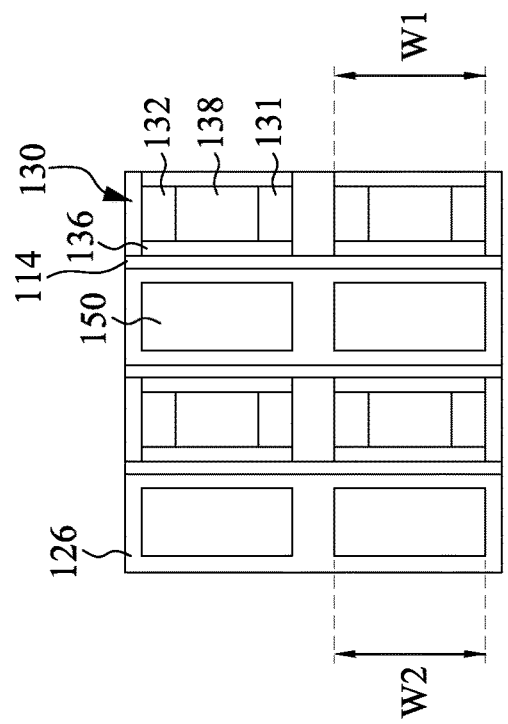
FIG. 4B is a top view of a portion of the semiconductor die of FIG. 1, indicated by the arrow B in FIG. 3.
Figure 5:
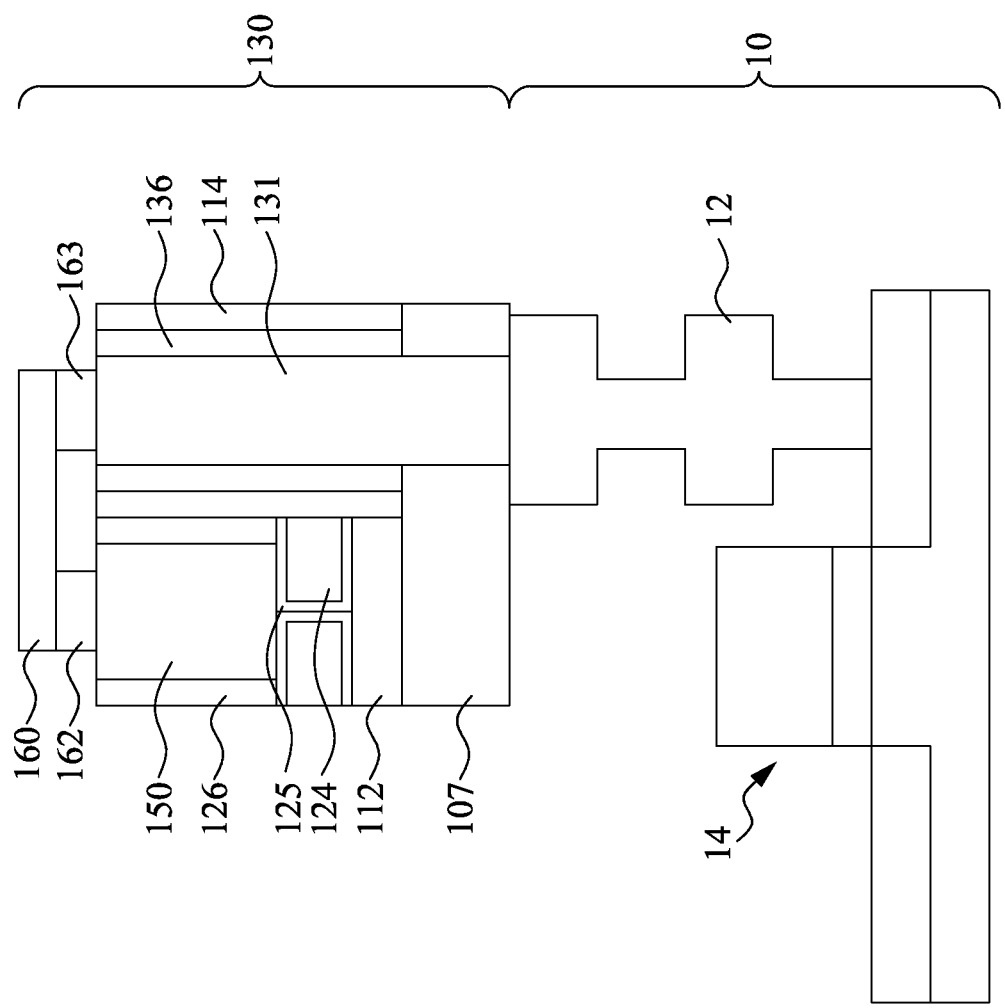
FIG. 5 is a side cross-section view of a portion of the semiconductor device of FIG. 1 taken along the along the line X-X in FIG. 2, showing a dummy memory device coupled to an external device, according to an embodiment.

As best shown in FIG. 3, the interface portions 104 include the array of dummy memory devices 130. As shown in FIGS. 3, 4B and 5, in some embodiments, each dummy memory device 130 includes a first interface via 131, and a second interface via 132 spaced apart from the first interface via 131 in the first direction (e.g., the X-direction). A dummy inner spacer 138 extends between the first interface via 131 and the second interface via 132 in the first direction. Each of the dummy memory device 130 also comprises a dummy channel layer 136 disposed on radially outer surfaces of the interface vias 131, 132 and the dummy inner spacer 138. A memory layer 114 of a corresponding row of active memory devices 110 extends from the device portion 102 to the interface portion 104 and is disposed on a radially outer surface of the dummy channel layer 136. Moreover, at least one gate layer 124 and at least one insulating layer 112 of the stack 108 is disposed on outer surface of the portion of the memory layer 114 included in each dummy memory device 130, depending on the location of the interface portion 104 at which a particular dummy memory device 130 is located.

In the embodiment shown in FIGS. 1-5, the dummy memory devices 130 are structurally similar to the active memory devices 110 and include similar features, i.e., interface vias 131, 132 that are structurally analogous to the source 120 and drain 122, a dummy inner spacer 138 analogous to the inner spacer 118, a dummy channel layer 136 analogous to the channel layer 116, and a portion of the memory layer 114 that is continuous from the device portion 102 to the interface portion 104. However, unlike the active memory devices 110, the dummy memory devices 130 do not perform any memory storage function. Instead, as shown in the side cross-section view of FIG. 5, the interface vias 131 and/or 132 may extend through the substrate 107, and are configured to be coupled to an external device 10. The external device 10 may include, for example, a printed circuit board or circuit having an external device via 12 to which a corresponding first interface via 131 and/or second interface via 132 is coupled (e.g., soldered, fusion bonded, welded, etc.). The external device 10 may include a circuit 14 (e.g., a transistor, switch, etc.) configured to selectively communicate an electrical signal to a corresponding interface via 131, 132 via the external device via 12.

The interface portions 104 may also include an interlayer dielectric (ILD) 126 disposed on portions of the insulating layers 112 and the gate layers 124 forming the interface portions 104, between adjacent rows of the dummy memory devices 130. The dielectric material of the ILD 126 may include SiO, phosphosilicate glass (PSG), borosilicate glass (BSG), boron-doped phosphosilicate Glass (BPSG), undoped silicate glass (USG), or combinations thereof.

The interface portions 104 also include an array of gate vias 150 formed through the ILD 126. Each row of the array of gate vias 150 extends in the first direction and is located parallel to a row of the array of dummy memory devices 130 in a second direction (e.g., the Y-direction) perpendicular to the first direction (e.g., the X-direction). Each of the dummy memory devices 130 may have a first width W1 in the first direction (e.g., the X-direction), which is approximately equal to a second width W2 of a gate via 150 disposed adjacent thereto in the first direction (e.g., the second width W2 is within ±10% of the first width W1).

Each gate via 150 is electrically coupled to at least one interface via (e.g., the interface via 131 and/or 132) of a dummy memory device 130 located adjacent thereto, as described herein. In some embodiments, the at least interface via 131, 132, and the gate vias 150 are formed from the same material. For example, the gate vias 150 and the interface vias 131, 132 of the memory devices may be formed simultaneously using the same fabrication steps.

Each gate via 150 is electrically coupled to a corresponding gate layer 124, as shown in FIG. 5. Moreover, at least on gate through via is coupled to each gate via 150 of the array of gate vias 150. At least one interface through via is coupled to each interface via 131, 132 of the array of the dummy memory devices 130. A through via cap 160 is coupled to the at least one through gate via of a gate via 150, and the at least one interface via 131, 132 of a corresponding dummy memory device 130 located adjacent to the respective gate via 150.

Figure 2:
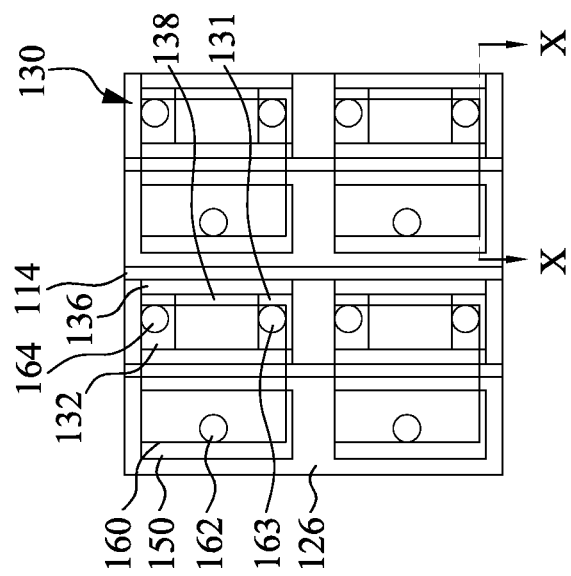
FIG. 2 is a top view of a portion of the semiconductor die of FIG. 1 indicated by the arrow A in FIG. 1.

For example, as shown in FIGS. 1-2 and 5, a gate through via 162 is coupled to a corresponding gate via 150 and projects upwards from the gate via 150 in the vertical direction (e.g., the Z-direction) away from the gate via 150. A first interface through via 163 is coupled to the first interface via 131 and a second interface through via 164 is coupled to the second interface via 132, the first interface through via 163 and the second interface through via 164 projecting upwards from the first interface via 131 and the second interface via 132 in the vertical direction, respectively. A through via cap 160 is coupled to the gate through via 162, the first interface through via 163, and the second interface through via 164. In this manner, the through via cap 160 electrically shorts the interface vias 131, 132 to a corresponding gate via 150 such that an electrical signal communicated to the first and/or second interface vias 131, 132 from the external device 10 via the external device via 12 is communicated to the gate via 150 via the through via cap 160. The gate via 150 communicates the electrical signal to a corresponding gate layer 124 so as to selectively activate a corresponding row of dummy memory devices 130. The gate through via 162 and the interface through vias 163, 164 may be formed from a conducting material for example, tungsten (W), copper (Cu), cobalt (Co), etc.

Figure 6A:
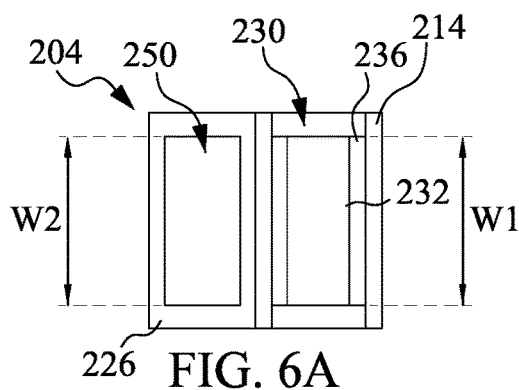
FIG. 6A is a top view of a portion of an interface portion of a semiconductor die including a dummy memory device and a gate via with a through via cap removed.
Figure 6B:
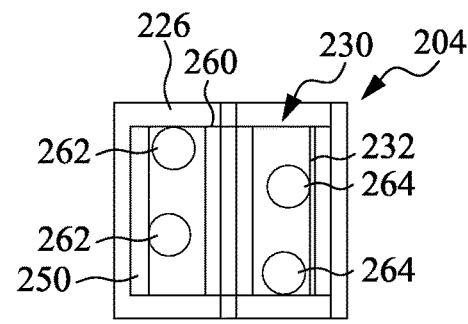
FIG. 6B is another view of the portion including the through via cap, according to an embodiment.

While FIGS. 1-4B show a particular embodiment of a dummy memory device 130, in other embodiments, the dummy memory devices 130 can have a structure that is different from the active memory devices 110. For example, FIG. 6A is a top view of a portion of an interface portion 204 of a semiconductor die, which includes a dummy memory device 230 and a gate via 250 with a through via cap 260 removed, and FIG. 6B is another view of the portion of the interface portion 204 including the through via cap 260, according to an embodiment. The dummy memory device 230 includes an interface via 232, a dummy channel layer 236 disposed on a radially outer surface of the interface via 232 in the second direction (e.g., the Y-direction), and a memory layer 214 disposed on radially outer surface of the dummy channel layer 236 in the second direction. The memory layer 214 extends from a device portion (not shown) to the interface portion (204), as described with respect to the semiconductor die 100.

Different form the dummy memory device 130, the dummy memory device 230 includes a single interface via 232 that extends the entire width of the dummy memory device 230. Moreover, the dummy memory device 230 has a first width W1 that is about equal to a second width of the gate via 250 disposed adjacent and parallel thereto. A pair of gate through vias 262 are coupled to the gate via 250, and a pair of interface through vias 264 are coupled to the interface via 232. A through via cap 260 is coupled to the gate through vias 262 and the interface through vias 264.

Figure 7A:
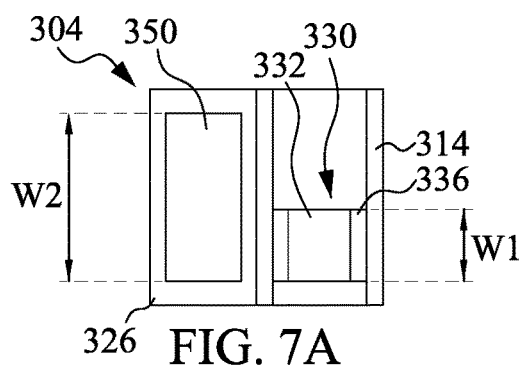
FIG. 7A is a top view of a portion of an interface portion of a semiconductor die including a dummy memory device and a gate via with a through via cap removed.
Figure 7B:
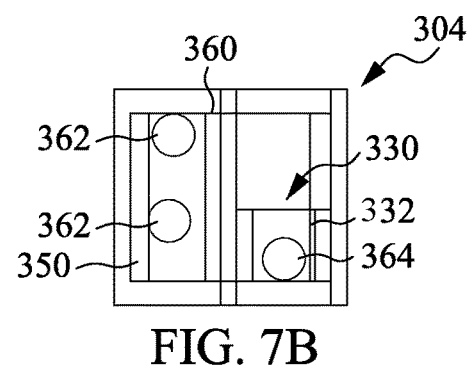
FIG. 7B is another view of the portion including the through via cap, according to another embodiment.

FIG. 7A is a top view of a portion of an interface portion 304 of a semiconductor die including a dummy memory device 330 and a gate via 350 with a through via cap 360 removed, and FIG. 7B is another view of the portion of the interface portion 304 including the through via cap 360, according to another embodiment. The dummy memory device 330 includes an interface via 332, a dummy channel layer 336 disposed on a radially outer surface of the interface via 332 in the second direction (e.g., the Y-direction), and a memory layer 314 disposed on radially outer surface of the dummy channel layer 336 in the second direction. The memory layer 314 extends from a device portion (not shown) to the interface portion 304, as described with respect to the semiconductor die 100.

The dummy memory device 330 includes a single interface via 332 that extends the entire width of the dummy memory device 330. Moreover, the dummy memory device 330 has a first width W1 that is smaller than a second width W2 of the gate via 350 disposed adjacent and parallel thereto. A pair of gate through vias 362 are coupled to the gate via 350, and a single interface through via 364 is coupled to the interface via 332. A through via cap 360 is coupled to the gate through vias 362 and the interface through via 364.

Figure 8A:
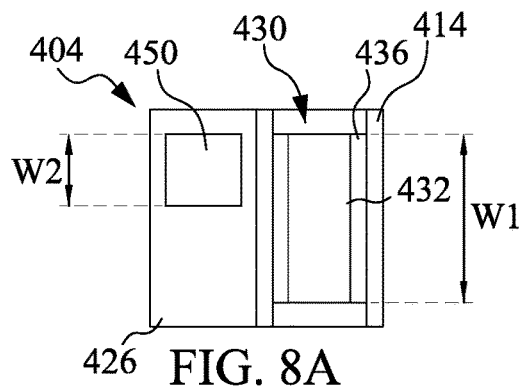
FIG. 8A is a top view of a portion of an interface portion of a semiconductor die including a dummy memory device and a gate via with a through via cap removed.
Figure 8B:
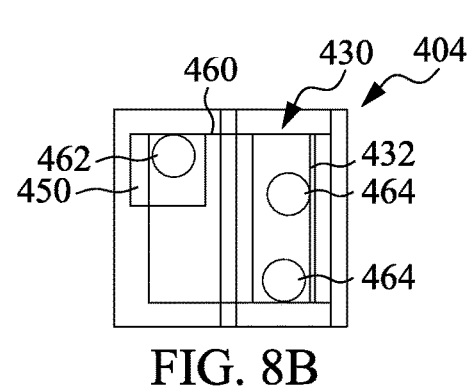
FIG. 8B is another view of the portion including the through via cap, according to still another embodiment.

FIG. 8A is a top view of a portion of an interface portion 404 of a semiconductor die including a dummy memory device 430 and a gate via 450 with a through via cap 460 removed, and FIG. 8B is another view of the portion of the interface portion 404 including the through via cap 460, according to still another embodiment. The dummy memory device 430 includes an interface via 432, a dummy channel layer 436 disposed on a radially outer surface of the interface via 432 in the second direction (e.g., the Y-direction), and a memory layer 414 disposed on radially outer surface of the dummy channel layer 436 in the second direction. The memory layer 414 extends from a device portion (not shown) to the interface portion 404, as described with respect to the semiconductor die 100.

The dummy memory device 430 includes a single interface via 432 that extends the entire width of the dummy memory device 430. Moreover, the dummy memory device 430 has a first width W1 that is larger than a second width W2 of the gate via 450 disposed adjacent and parallel thereto. A single gate through via 462 is coupled to the gate via 450, and a pair of interface through vias 464 are coupled to the interface via 432. A through via cap 460 is coupled to the gate through via 462 and the interface through vias 464.

Figure 9A:
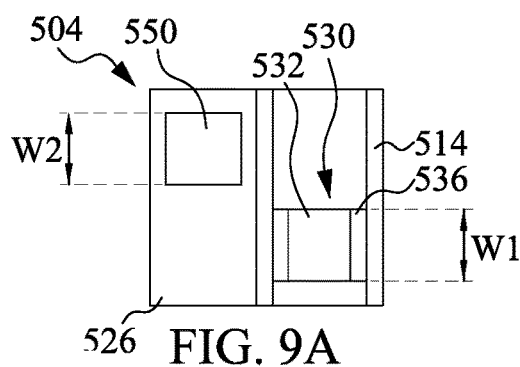
FIG. 9A is a top view of a portion of an interface portion of a semiconductor die including a dummy memory device and a gate via with a through via cap removed.
Figure 9B:
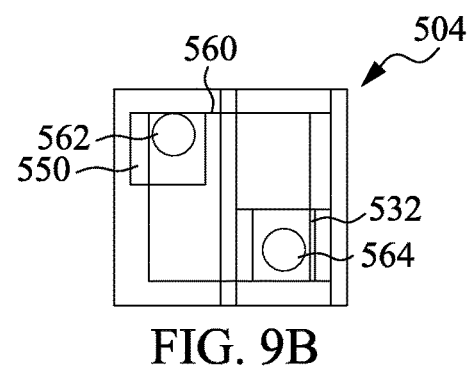
FIG. 9B is another view of the portion including the through via cap, according to yet another embodiment.

FIG. 9A is a top view of a portion of an interface portion 504 of a semiconductor die including a dummy memory device 530 and a gate via 550 with a through via cap 560 removed, and FIG. 9B is another view of the portion of the interface portion 504 including the through via cap 560, according to yet another embodiment. The dummy memory device 530 includes an interface via 532, a dummy channel layer 536 disposed on a radially outer surfaces of the interface via 532 in the second direction (e.g., the Y-direction), and a memory layer 514 disposed on radially outer surface of the dummy channel layer 536 in the second direction. The memory layer 514 extends from a device portion (not shown) to the interface portion 504, as described with respect to the semiconductor die 100.

The dummy memory device 530 includes a single interface via 532 that extends the entire width of the dummy memory device 530. The dummy memory device 530 has a first width W1 that is about the same as a second width W2 of the gate via 550 disposed parallel to. However, the gate via 550 is axially offset in the first direction (e.g., the X-direction) from the corresponding dummy memory device 530 and thereby, the corresponding interface via 532 to which the gate via 550 is coupled. A single gate through via 562 is coupled to the gate via 550, and a single interface through via 564 is coupled to the interface via 532. A through via cap 560 is coupled to the gate through via 562 and the interface through vias 564.

Figure 10A:
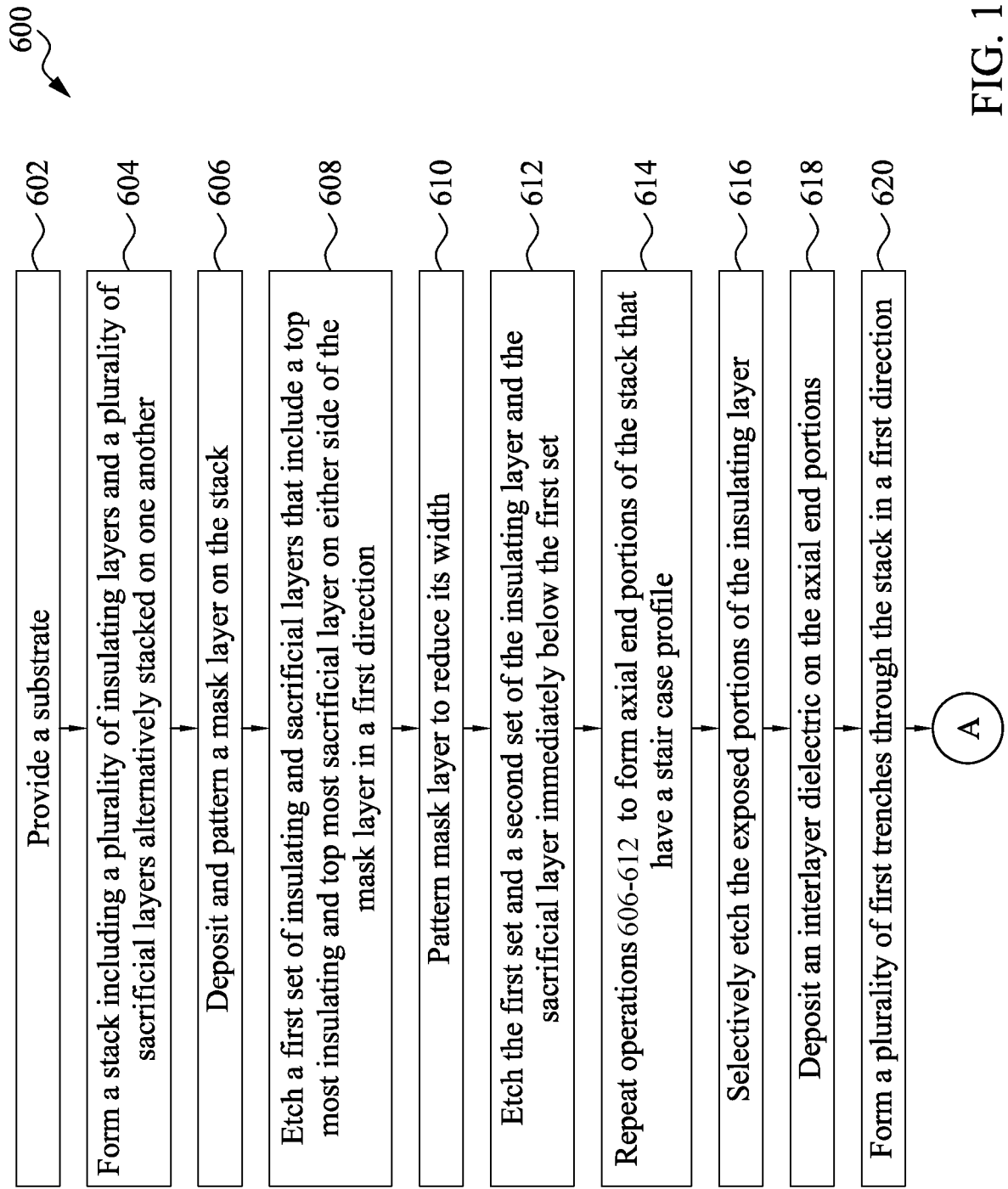
FIGS. 10A-10C are schematic flow charts of a method for forming a semiconductor die, according to an embodiment.
Figure 10B:
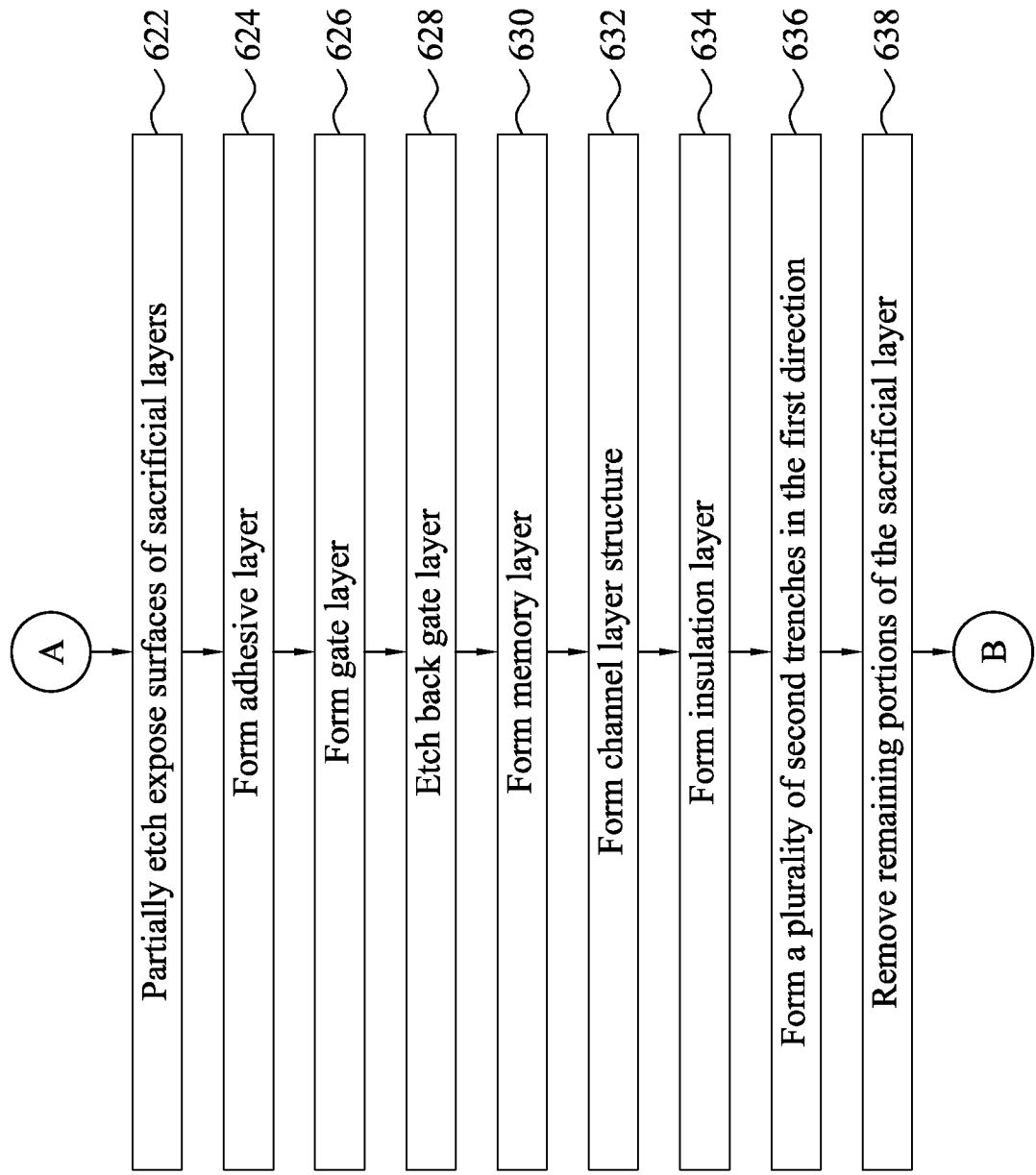
Figure 10C:
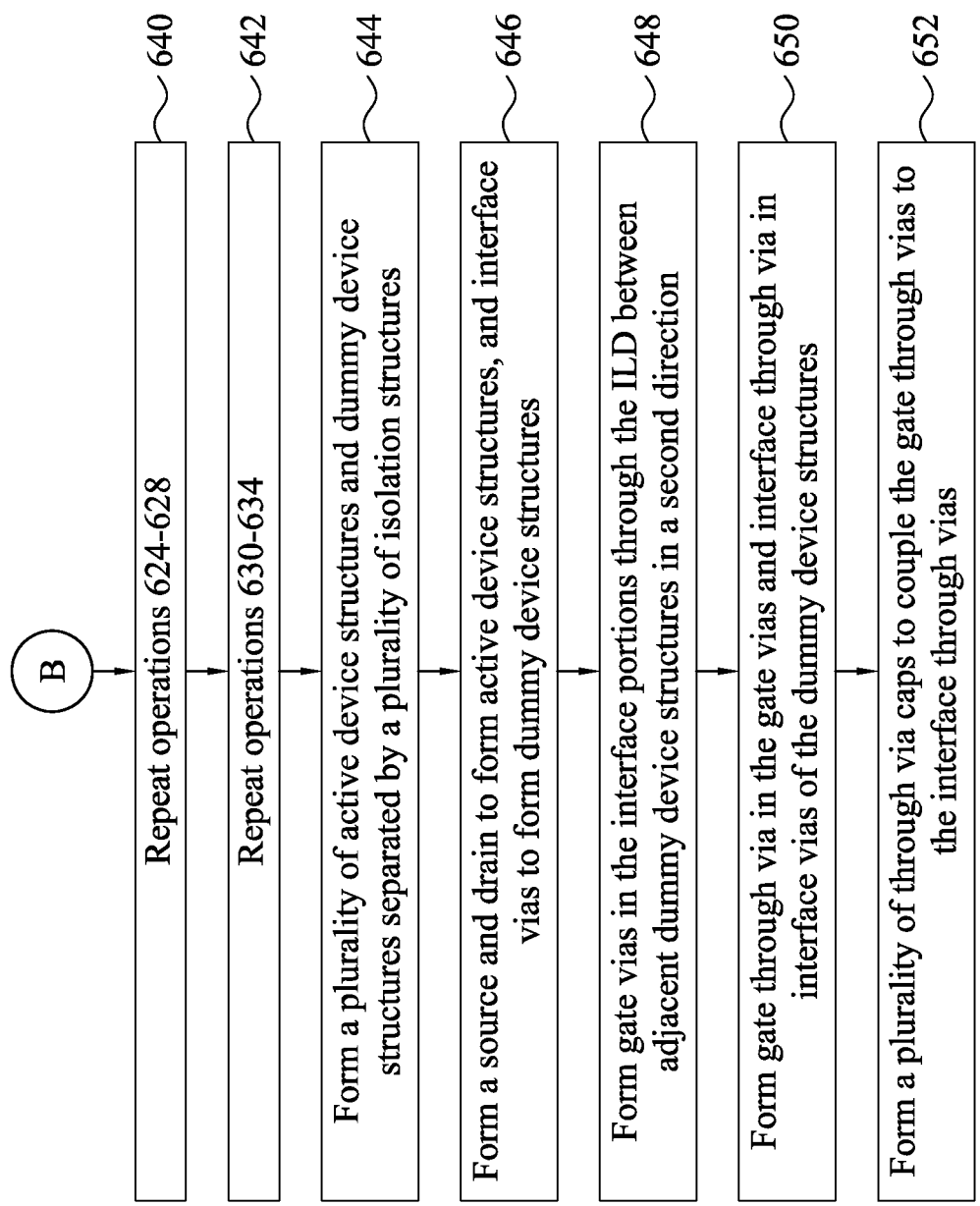

FIGS. 10A-10C illustrate a flowchart of a method 600 for forming a semiconductor die 700, for example, a die including a plurality of 3D memory devices (e.g., any of the semiconductor dies described with respect to FIGS. 1-9B), according to an embodiment. For example, at least some of the operations (or steps) of the method 600 may be used to form a 3D memory device (e.g., the semiconductor die 100), a nanosheet transistor device, a nanowire transistor device, a vertical transistor device, or the like. It should be noted that the method 600 is merely an example, and is not intended to limit the present disclosure. Accordingly, it is understood that additional operations may be provided before, during, and after the method 600 of FIGS. 10A-10C, and that some other operations may only be described briefly described herein. In some embodiments, operations of the method 600 may be associated with perspective views of the example semiconductor die 700 at various fabrication stages as shown in FIGS. 11, 12, 13, 14, 15, 16, 17, 18, 19, 20, 21, 22, 23, 24, 25, 26, 27, 28, 29, 30, and 31, and in some embodiments are represented with respect to the semiconductor die 700 that represents a 3D memory device, the operations are equally applicable to any other semiconductor device, for example, a semiconductor die 800 shown in FIGS. 32A-32B or any other semiconductor die (e.g., a GAA FET device, a nanosheet transistor device, a nanowire transistor device, a vertical transistor device, etc.). Although FIGS. 11-31 illustrate the semiconductor die 700 including the plurality of active memory devices 110 and dummy memory devices 130, it is understood the semiconductor die 700 or 800 may include a number of other devices such as inductors, fuses, capacitors, coils, etc., which are not shown in FIGS. 11-32B, for purposes of clarity of illustration.

The method 600 may generally include providing a stack comprising a plurality of insulating layers and a plurality of sacrificial layers alternatively stacked on top of each other. One of the insulating layers may form a bottom layer, and another of the insulating layers may form a top layer of the stack. The method 600 may also include forming at least one interface portion on axial ends of the stack in a first direction (e.g., the X-direction) such that the stack forms a device portion interposed between the at least one interface portion, the at least one interface portion having a staircase profile in a vertical direction (e.g., the Z-direction). The method 600 also includes depositing an ILD on the at least one interface portion. The method 600 also includes forming a plurality of trenches extending though the stack in the first direction (e.g., the X-direction), the plurality of trenches extending through the device portion and the at least one interface portion. The method 600 may also include forming an array of active memory devices in the device portion and an array of dummy memory devices in the at least one interface portion. The active memory devices and the dummy memory devices are formed simultaneously.

Each of the active memory devices may include a source, a drain, an inner spacer, a channel layer, and a memory layer. Moreover, the dummy memory device may include at least one interface via, optionally a dummy inner spacer, a channel layer, and the memory layer. Each row of the array of active memory devices and a corresponding row of the array of dummy memory devices include the memory layer which extends from the device portion to the at least one interface portion along the respective row of active memory devices to the corresponding row of the array of dummy memory devices such that the memory layer is continuous from the device portion to the at least one interface portion. The method 600 may also include forming an array of gate vias through the ILD. Each row of gate vias may extend in the first direction (e.g., the X-direction) and located parallel to a row of the array of dummy memory devices in the second direction (e.g., the Y-direction) perpendicular to the first direction. In some embodiments, the method 600 may include forming the gate vias simultaneously with forming the source, the drain, and the interface portions, for example, as shown with respect to the semiconductor die 800 shown in FIGS. 32A-32B. The method 600 may also include electrically coupling each gate via to the at least one interface via of a dummy memory device located adjacent thereto (e.g., using through via caps such as the through via caps 160, 260, 360, 460, 560).

Figure 11:
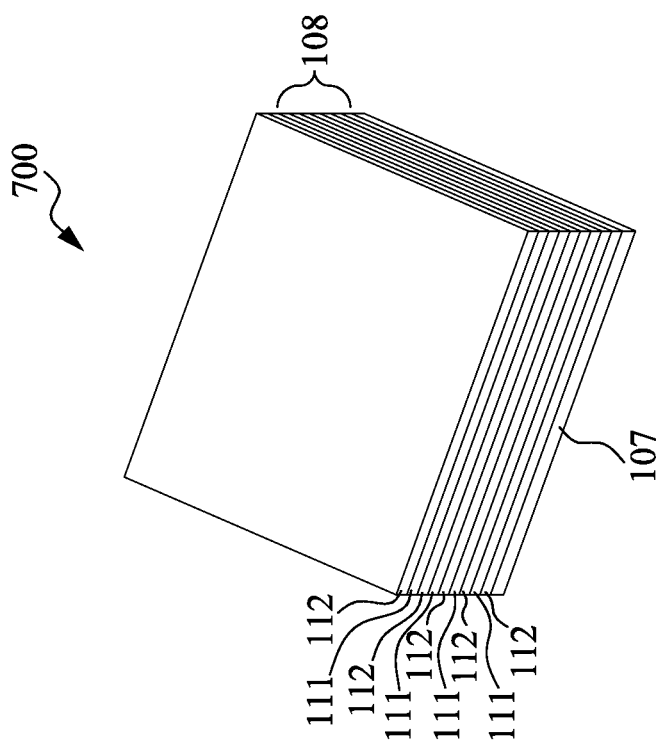

Expanding further, the method 600 starts with operation 602 that includes providing a substrate, for example, the substrate 107 shown in FIG. 11. The substrate 107 may be a semiconductor substrate, such as a bulk semiconductor, a semiconductor-on-insulator (SOI) substrate, or the like, which may be doped (e.g., with a p-type or an n-type dopant) or undoped. The substrate 107 may be a wafer, such as a silicon wafer. Generally, an SOI substrate includes a layer of a semiconductor material formed on an insulator layer. The insulator layer may be, for example, a buried oxide (BOX) layer, a SiO layer, a SiN layer, or the like. The insulator layer is provided on a substrate, typically a silicon or glass substrate. Other substrates, such as a multi-layered or gradient substrate may also be used. In some embodiments, the semiconductor material of the substrate 107 may include silicon; germanium; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof.

At 604, a stack (e.g., the stack 108 shown in FIG. 11) is formed on the substrate 107. The stack includes a plurality of insulating layers (e.g., the insulating layers 112) and a plurality of sacrificial layers (e.g., the sacrificial layers 111 shown in FIG. 11) alternately stacked on top of each other in the vertical direction (e.g., the Z-direction). Corresponding to operations 602-604, FIG. 11 is a top, perspective view of the stack 108 disposed on the substrate 107. The insulating layers 112 and the sacrificial layers 111 are alternately disposed on top of one another in the Z-direction. For example, one of the sacrificial layers 111 is disposed over one of the insulating layers 112, then another one of the insulating layers 112 is disposed on the sacrificial layer 111, so on and so forth. As shown in FIG. 11, a topmost layer (e.g., a layer distal most from the substrate 107) and a bottommost layer (e.g., a layer most proximate to the substrate 107) of the stack 108 may include an insulating layer 112. While FIG. 11 shows the stack 108 as including 5 insulating layers 112 and 4 sacrificial layers, the stack 108 may include any number of insulating layers 112 and sacrificial layers 111 (e.g., 4, 5, 6, 7, 8, or even more). In various embodiments, if the number of sacrificial layers 111 in the stack 108 is n, a number of insulating layers 112 in the stack 108 may be n+1.

Each of the plurality of insulating layers 112 may have about the same thickness, for example, in a range of about 5 nm to about 100 nm, inclusive. Moreover, the sacrificial layers 111 may have the same thickness or different thickness from the insulating layers 112. The thickness of the sacrificial layers 111 may range from a few nanometers to few tens of nanometers (e.g., in a range of 5 nm to 100 nm, inclusive).

The insulating layers 112 and the sacrificial layers 111 have different compositions. In various embodiments, the insulating layers 112 and the sacrificial layers 111 have compositions that provide for different oxidation rates and/or different etch selectivity between the respective layers. In some embodiments, the insulating layers 112 may be formed from SiO, and the sacrificial layers 111 may be formed from SiN. The sacrificial layers 111 are merely spacer layers that are eventually removed and do not form an active component of the semiconductor die 700.

In various embodiments, the insulating layers 112 and/or the sacrificial layers 111 may be epitaxially grown from the substrate 107. For example, each of the insulating layers 112 and the sacrificial layers 111 may be grown by a molecular beam epitaxy (MBE) process, a chemical vapor deposition (CVD) process such as a metal organic CVD (MOCVD) process, a furnace CVD process, and/or other suitable epitaxial growth processes. During the epitaxial growth, the crystal structure of the substrate 107 extends upwardly, resulting in the insulating layers 112 and the sacrificial layers 111 having the same crystal orientation as the substrate 107. In other embodiments, the insulating layers 112 and the sacrificial layers 111 may be grown using an atomic layer deposition (ALD) process.

Figure 12:
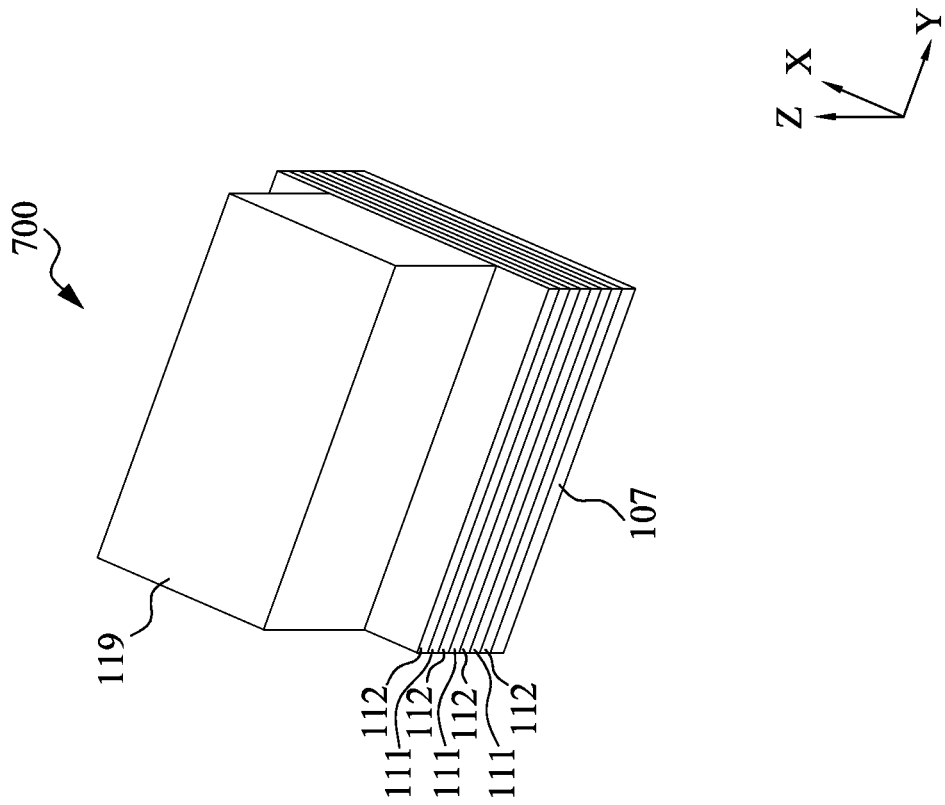
FIGS. 11, 12, 13, 14, 15, 16, 17, 18, 19, 20, 21, 22, 23, 24, 25, 26, 27, 28, 29, 30, and 31 illustrate various views of an example semiconductor die (or a portion of the example semiconductor die) during various fabrication stages, made by the method of FIGS. 10A-10C, in accordance with some embodiments.

Operations 606 to 616 involve fabrication of interface portions that have a staircase or step profile in the Z-direction. For example, at operation 606, a mask layer (e.g., the mask layer 119 shown in FIG. 12) is deposited on the stack, and is patterned. For example, as shown in FIG. 12 that shows a top, perspective view of the stack 108, the mask layer 119 is deposited on the stack 108, i.e., on the topmost insulating layer 112. In some embodiments, the mask layer 119 may include a photoresist (e.g., a positive photoresist or a negative photoresist), for example, a single layer or multiple layers of the same photoresist or different photoresists. In other embodiments, the mask layer 119 may include a hard mask layer, for example, a polysilicon mask layer, a metallic mask layer, or any other suitable mask layer.

The mask layer 119 is patterned to etch portions of the mask layer 119 at axial ends off the mask layer 119 in the first direction (e.g., the X-direction), so as to reduce its axial width. The mask layer 119 may be patterned using photolithography techniques. Generally, photolithography techniques utilize a photoresist material that forms the mask layer 119 and that is deposited, irradiated (exposed), and developed to remove a portion of the photoresist material, in this instance, end portions of the mask layer 119. The remaining mask layer 119 protects the underlying material, such as a portion of the stack 108 below the patterned mask layer 119, from subsequent processing steps, such as etching.

Figure 13:
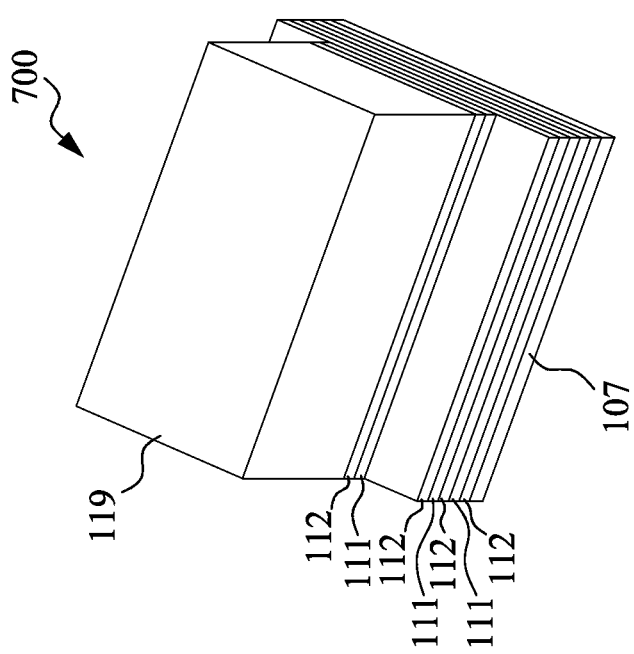

At operation 608, a first set or pair of insulating layers 112 and sacrificial layers 111 that include a topmost insulating layer 112 and a topmost sacrificial layer 111 on either side of the mask layer 119 in the first direction (e.g., the X-direction), are etched. Corresponding to operation 608, FIG. 13 is a top, perspective view of the semiconductor die 700 including the stack 108 after etching the topmost insulating layer 112 and the topmost sacrificial layer 111. As shown in FIG. 13, the patterned mask layer 119 is used to etch the exposed portions of the topmost insulating layer 112 and the topmost sacrificial layer 111 included in the first set so as to form a step from the first set to a second set of insulating and sacrificial layers 112, 111 that are disposed immediately below the first set. In some embodiments, the etch may be an anisotropic etch (e.g., a reactive ion etch (RIE), neutral beam etch (NBE), deep reactive ion etch (DRIE), and the like, or combinations thereof,) which selectively etches the exposed portions of the topmost insulating and sacrificial layers 112, 111 in the Z-direction.

In some embodiments, the etching of the first set may include a first etch that selectively etches the insulating layer 112 until the underlying sacrificial layer 111 is exposed, and a second subsequent etch that etches the sacrificial layer 111 until the underlying insulating layer 112 is exposed. Such two-step etching process may allow the underlying sacrificial layer 111 or the insulating layer 112 to serve as a etch stop such that once a portion of the layer immediately above it has been removed, so as to prevent over-etching.

Figure 14:
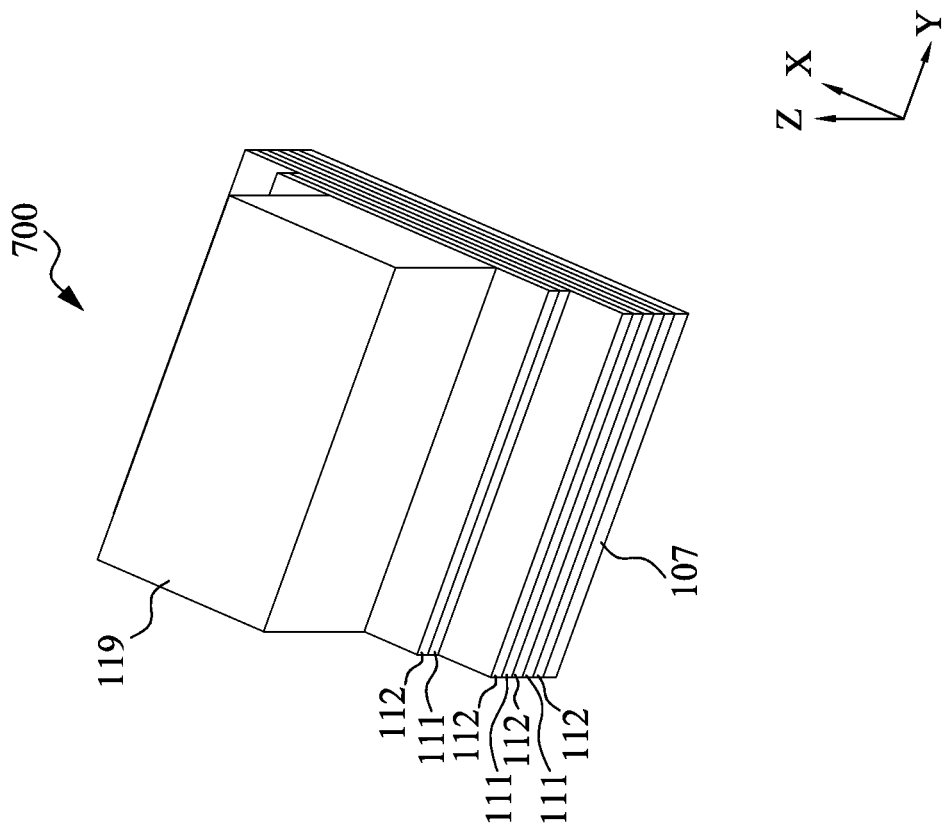

At operation 610, the mask layer 119 is again etched to reduce its width in the X-direction. Corresponding to operation 610, FIG. 14 is a top, perspective view of the semiconductor die 700 after etching the mask layer 119. As shown in FIG. 14, axial ends of the mask layer 119 may be etched using the same process as described with respect to operation 606. In some embodiments, a width of the portion of the mask layer 119 that is etched and removed at operation 610 is the same as width of a portion of the mask layer 119 that is etched and removed at operation 606.

Figure 15:
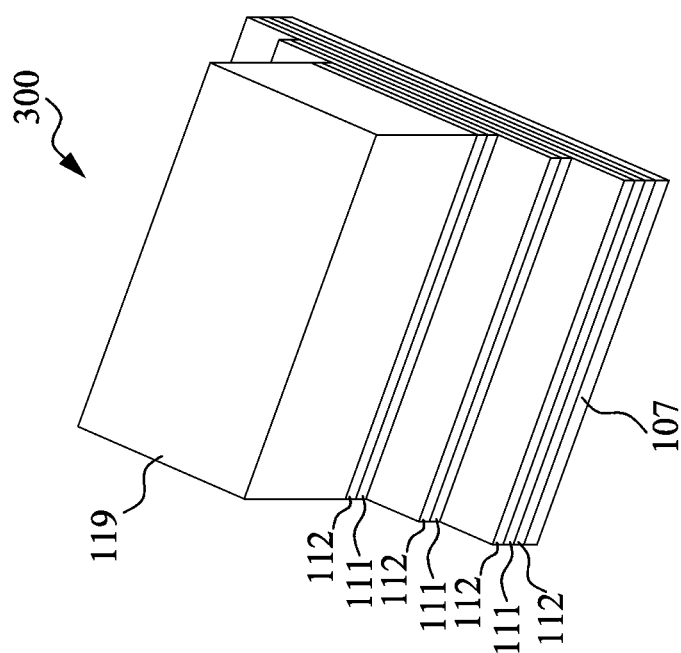

At operation 612, the first set of the insulating layer and the sacrificial layer, and the second set of the insulating layer and the sacrificial layer are etched. Corresponding to operation 612, FIG. 15 is a top, perspective view of the semiconductor die 700 after etching the first and second sets. As shown in FIG. 15, the first set of the insulating layer 112 and the sacrificial layer 111, and the second set of the insulating layer 112 and the sacrificial layer 111 are etched using the same process as described with respect to operation 608, so as to also form a step from the second set to a third set of insulating and sacrificial layers 112, 111 immediately below the second set. Moreover, the etching also causes a reduction in the length of the first set of insulating and sacrificial layers 112, 111, and the second set of insulating and sacrificial layers 112, 111, in the X-direction. The reduction in length of these layers is proportional to the reduction in width of the mask layer 119 at operation 610 in the X-direction.

Figure 16:
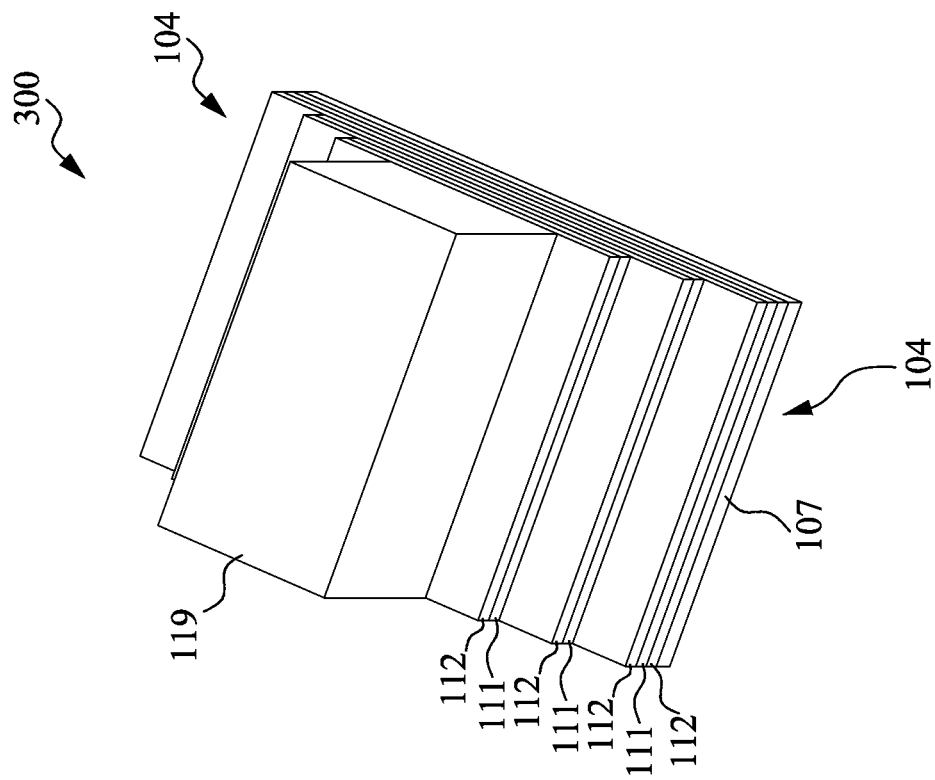

At operation 614, the operations 606-612 are repeated so as to form axial ends of the stack that have a staircase profile on either side of the mask layer 119. For example, corresponding to operation 614, FIG. 16 shows a top, perspective view of the semiconductor die 700. As shown in FIG. 16, operations 606-612 are repeated, until steps are formed from a bottommost set of insulating and sacrificial layers 112, 111 to the first set of insulating and sacrificial layers 112, 111, and axial end portions 104 of the stack 108 in the first direction (e.g., the X-direction) have a staircase profile in the vertical direction (e.g., the Z-direction), from the bottommost set to the first set (i.e., the topmost set) of insulating and sacrificial layers 112, 111. It should be appreciated that the bottommost insulating layer 112 is not included in the bottommost set of insulating and sacrificial layers 112, 111.

Figure 18:
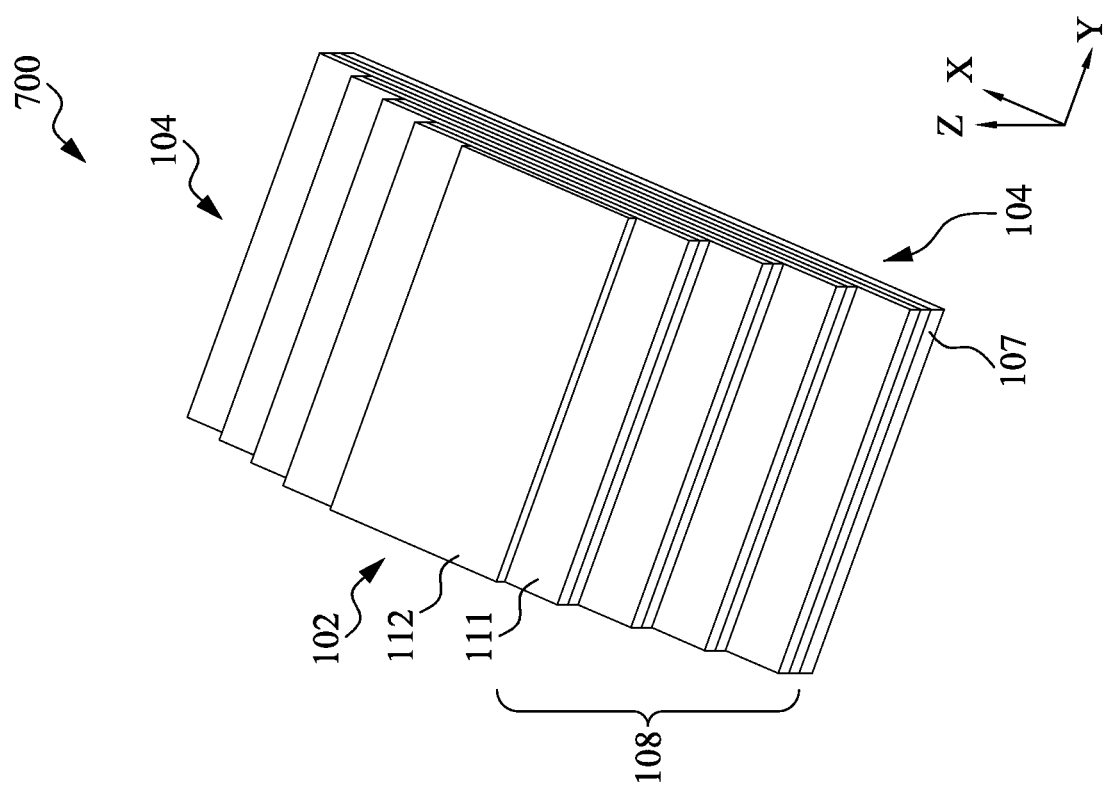
Figure 17:
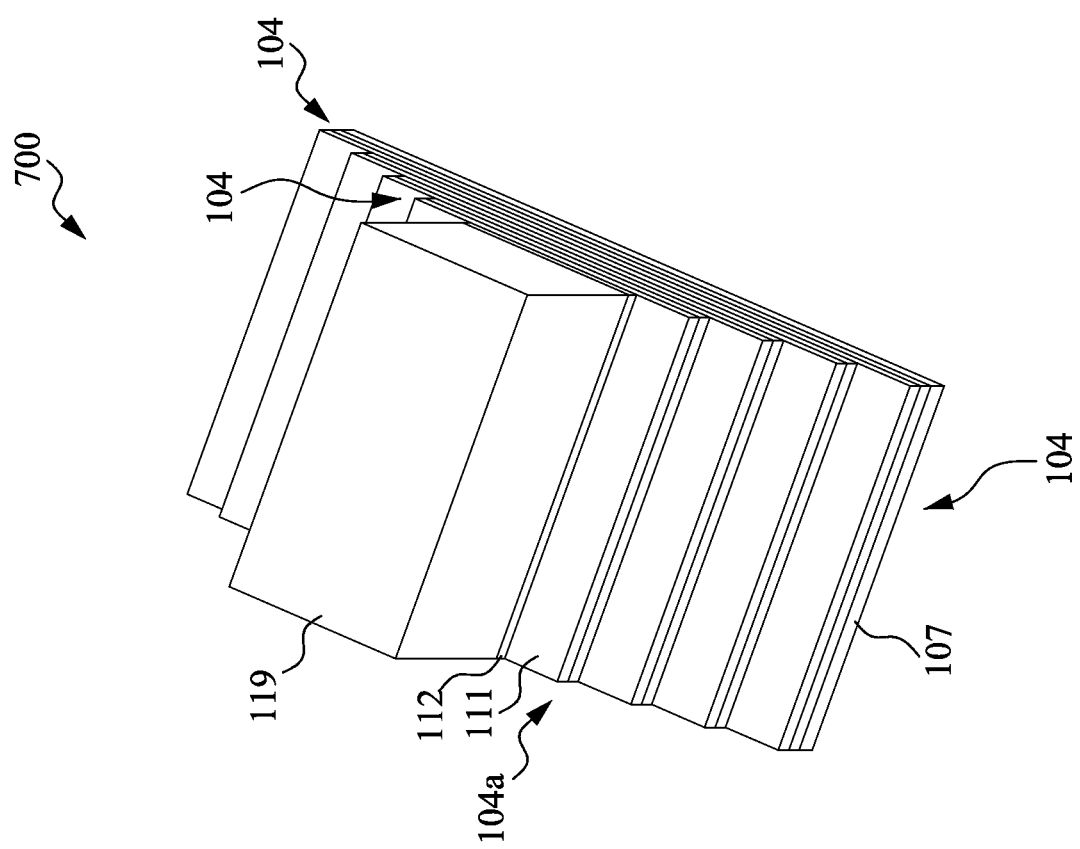

At operation 616, exposed portions of the insulating layers 112 are etched. Corresponding to operation 616, FIG. 17 is a top, perspective view of the semiconductor die 700. As shown in FIG. 17, the exposed portions of the insulating layers 112 included in the axial end portions 104 of the stack 108 on either side of the mask layer 119 in the X-direction are selectively etched (e.g., using an anisotropic etch such as RIE, NBE, DRIE, and the like, or combinations thereof.) For example, the mask layer 119 may be etched to reduce its width and exposed portion of the insulating layers 112 on either side of the mask layer 119 are etched to expose a portion of each sacrificial layer 111 that is located in the axial end portions 104 below the etched portions of the insulating layers 112. The axial end portions 104 form the interface portions 104 of the semiconductor die 700, as shown in FIG. 18. The mask layer 119 is then removed (e.g., via an isotropic etch in solvent or etchant.) An array of memory devices 110 formed in a central portion (device portion) 102 of stack 108 located between the axial end portions 104 so as to form the device portion 102 in later operations described herein.

Figure 19:
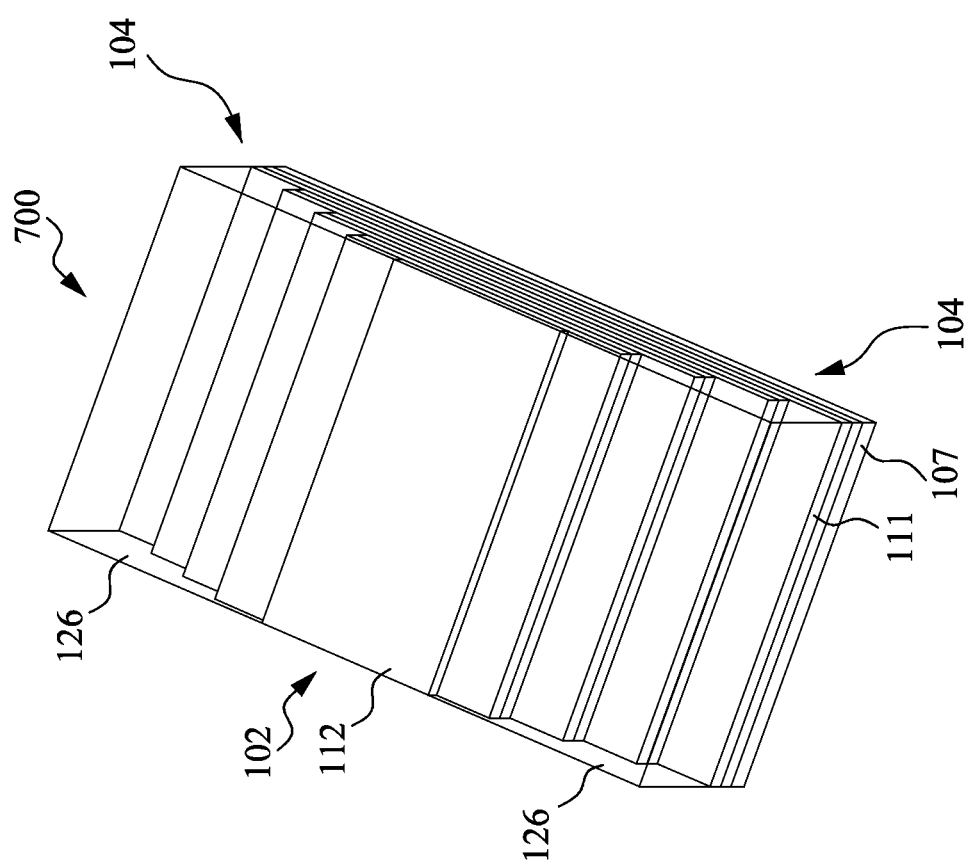

At operation 618, an ILD is deposited on the axial ends of the stack that have the staircase profile. Corresponding to operation 618, FIG. 19 is a top, perspective view of the semiconductor die 700 after formation of the ILD 126. The ILD 126 is deposited on the interface portions 104. The ILD 126 can be formed by depositing a dielectric material in bulk over the partially formed semiconductor die 700 (e.g., a 3D memory device), and polishing the bulk dielectric back (e.g., using CMP) to the level off the topmost insulating layer 112 such that the ILD 126 is only disposed on the axial end portions 104. The dielectric material of the ILD 126 may include SiO, phosphosilicate glass (PSG), borosilicate glass (BSG), boron-doped phosphosilicate Glass (BPSG), undoped silicate glass (USG), or combinations thereof.

Figure 20:
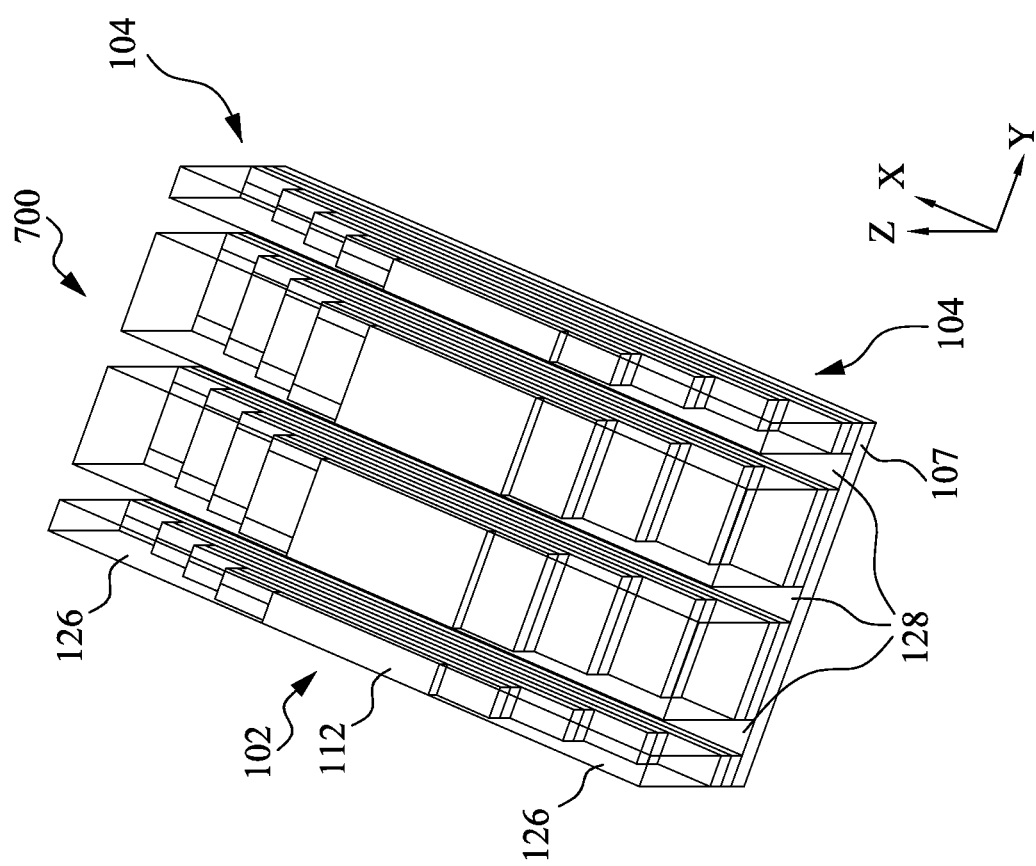

At operation 620, a plurality of first trenches are formed through the stack in the first direction (e.g., the X-direction), the plurality of trenches extending from the device portion to the interface portions. Corresponding to operation 620, FIG. 20 is a top, perspective view of the semiconductor die 700 after a plurality of first trenches 128 extending in the X-direction, have been formed through the stack 108 up to the substrate 107 by etching the stack 108 and the ILD 126 in the Z-direction. The etching process for forming the plurality of trenches 128 may include a plasma etching process, which can have a certain amount of anisotropic characteristic. For example, the trenches 128 may be formed, for example, by depositing a photoresist or other masking layer on a top surface of the semiconductor die 700, i.e., the top surface of the topmost insulating layer 112 of the stack and a top surface of the ILD 126, and a pattern corresponding to the trenches 128 defined in the masking layer (e.g., via photolithography, e-beam lithography, or any other suitable lithographic process). In other embodiments, a hard mask may be used.

Subsequently, the device portion 102 and the interface portions 104 may be etched using a plasma etching process (including radical plasma etching, remote plasma etching, and other suitable plasma etching processes, RIE, DRIE), gas sources such as $Cl_2$, HBr, $CF_4$, $CHF_3$, $CH_2F_2$, $CH_3F$, $C_4F_6$, $BCl_3$, $SF_6$, $H_2$, $NF_3$, and other suitable etch gas sources and combinations thereof can be used with passivation gases such as $N_2$, $O_2$, $CO_2$, $SO_2$, CO, $CH_4$, $SiCl_4$, and other suitable passivation gases and combinations thereof. Moreover, for the plasma etching process, the gas sources and/or the passivation gases can be diluted with gases such as Ar, He, Ne, and other suitable dilutive gases and combinations thereof to form the trenches 128. As a non-limiting example, a source power of 10 Watts to 3,000 Watts, a bias power of 0 watts to 3,000 watts, a pressure of 1 millitorr to 5 torr, and an etch gas flow of 0 sccm to 5,000 sccm may be used in the etching process. However, it is noted that source powers, bias powers, pressures, and flow rates outside of these ranges are also contemplated. As shown in FIG. 20, the etch used to form the plurality of trenches 128 etches through each of the sacrificial layers 111 and insulating layers 112 of the stack 108 such that each of the plurality of trenches 128 extend form the topmost insulating layer 112 through the bottommost insulating layer 112 to the substrate 107.

Figure 21:
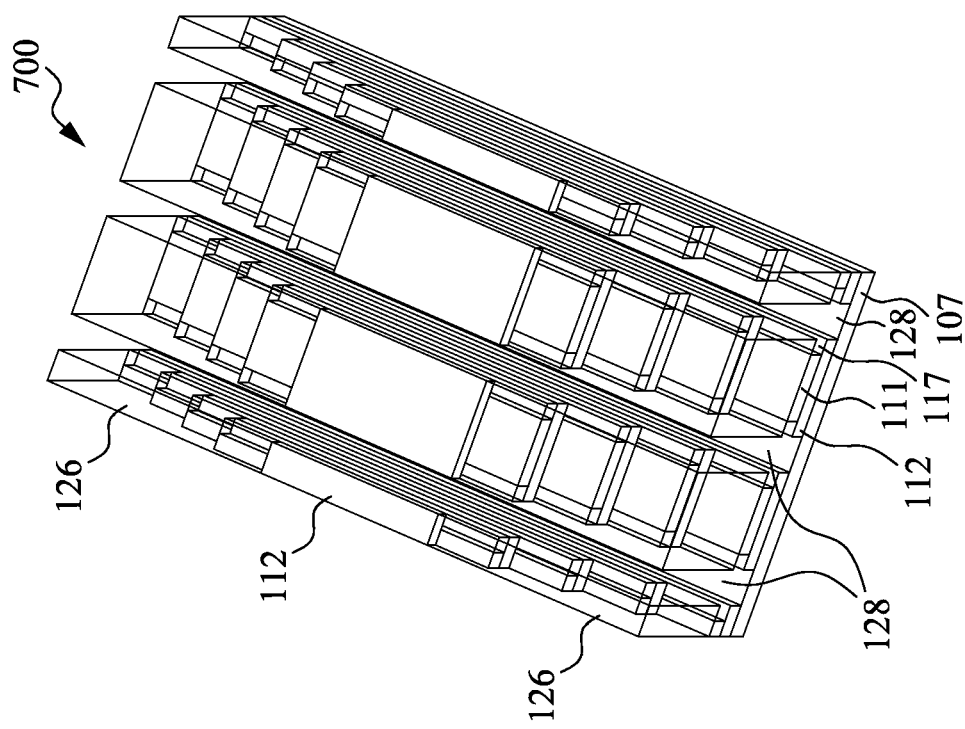

At operation 622, exposed surfaces of the sacrificial layers within the trenches are partially etched so as to reduce a width of the sacrificial layers relative to the insulating layers in the stack. Corresponding to operations 622, FIG. 21 is a top, perspective view of the semiconductor die 700 after partially etching exposed surfaces of the sacrificial layers 111 that are located in the trenches 128. For example, the exposed surfaces extend in the X-direction and etching the exposed surfaces of the sacrificial layers 111 reduces a width of the insulating layers 112 on either side of the sacrificial layers 111 in the Y-direction. In some embodiments, the sacrificial layers 111 may be etched using a wet etch process (e.g., hydrofluoric etch, buffered hydrofluoric acid). In other embodiments, the exposed surfaces of the sacrificial layers 111 may be partially etched using a plasma etching process (including radical plasma etching, remote plasma etching, and other suitable plasma etching processes, RIE, DRIE), gas sources such as $Cl_2$, HBr, $CF_4$, $CHF_3$, $CH_2F_2$, $CH_3F$, $C_4F_6$, $BCl_3$, $SF_6$, $H_2$, $NF_3$, and other suitable etch gas sources and combinations thereof can be used with passivation gases such as $N_2$, $O_2$, $CO_2$, $SO_2$, CO, $CH_4$, $SiCl_4$, and other suitable passivation gases and combinations thereof. Moreover, for the plasma etching process, the gas sources and/or the passivation gases can be diluted with gases such as Ar, He, Ne, and other suitable dilutive gases and combinations thereof. As a non-limiting example, a source power of 10 Watts to 3,000 Watts, a bias power of 0 watts to 3,000 watts, a pressure of 1 millitorr to 5 torr, and an etch gas flow of 0 sccm to 5,000 sccm may be used in the etching process. However, it is noted that source powers, bias powers, pressures, and flow rates outside of these ranges are also contemplated.

Partially etching the sacrificial layers in the Y-direction reduces a width of the sacrificial layers 111 relative to the insulating layers 112 disposed in the stack 108 such that first cavities 117 are formed whose boundaries are formed by top and bottom surfaces of adjacent insulating layers 112 and a surface of the partially etched sacrificial layers 111 that face the first trenches 128 and extend in the X-direction. A portion of the cavities 117 proximate to axial ends of the interface portions 104 may have a portion of its boundary formed by a bottom surface of the ILD 126.

Figure 22:
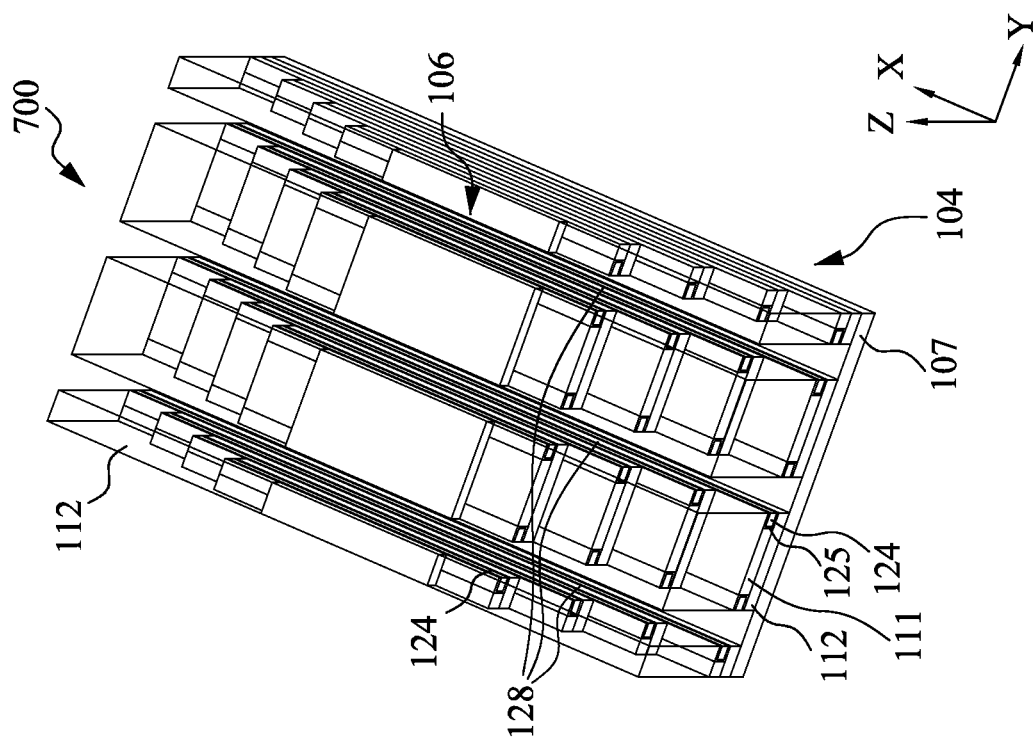

At operation 624 an adhesive layer is formed on sidewalls of the cavities. At operation 626, gate layers are formed in the first cavities located in the trenches. At operation 628, exposed edges of the gate layers may be etched back such that the edges of the gate layers facing the trenches are axially aligned in the Z-direction with corresponding edges of the insulating layers 112 disposed adjacent thereto. Corresponding to operations 624-628, FIG. 22 is a top, perspective view of the semiconductor die 700 after forming the adhesive layers 125 and gate layers 124 in the cavities 117 located in the trenches 128. In various embodiments, the adhesive layers 125 may include a material that has good adhesion with each of the insulating layers 112, the sacrificial layers 111, and the gate layer 124, for example, Ti, Cr, etc. The adhesive layers 125 may be deposited using any suitable method including, for example, molecular beam deposition (MBD), atomic layer deposition (ALD), PECVD, and the like. In some embodiments, the adhesive layer 125 may have a thickness in a range of 0.1 nm to 5 nm, inclusive.

In various embodiments, the gate layers 124 are formed by filling a gate dielectric and/or gate metal in the cavities 117 over the adhesive layer 125, such that the gate layers 124 inherit the dimensions and profiles of the cavities 117. In various embodiments, the gate layers 124 may be formed from a high-k dielectric material. Although, each of gate layer 124 shown in FIG. 22 is shown as a single layer, in other embodiments, the gate layer 124 can be formed as a multi-layer stack (e.g., including a gate dielectric layer and a gate metal layer), while remaining within the scope of the present disclosure. The gate layers 124 may be formed of different high-k dielectric materials or a similar high-k dielectric material. Example high-k dielectric materials include a metal oxide or a silicate of Hf, Al, Zr, La, Mg, Ba, Ti, Pb, and combinations thereof. The gate layers 124 can be deposited using any suitable method, including, for example, molecular beam deposition (MBD), atomic layer deposition (ALD), PECVD, and the like.

The gate metal may include a stack of multiple metal materials. For example, the gate metal may be a p-type work function layer, an n-type work function layer, multi-layers thereof, or combinations thereof. The work function layer may also be referred to as a work function metal. Example p-type work function metals that may include TiN, TaN, Ru, Mo, Al, WN, $ZrSi_2$, $MoSi_2$, $TaSi_2$, $NiSi_2$, WN, other suitable p-type work function materials, or combinations thereof. Example n-type work function metals that may include Ti, Ag, TaAl, TaAlC, TiAlN, TaC, TaCN, TaSiN, Mn, Zr, other suitable n-type work function materials, or combinations thereof. A work function value is associated with the material composition of the work function layer, and thus, the material of the work function layer is chosen to tune its work function value so that a target threshold voltage $V_t$ is achieved in the device that is to be formed. The work function layer(s) may be deposited by CVD, physical vapor deposition (PVD), ALD, and/or other suitable process.

Formation of the gate layers 124 in the cavities 117 may cause radial edges of the gate layers 124 in the Y-direction to protrude radially outwards of the cavities 117, i.e., radially outwards of the corresponding edges of the insulating layers 112, and/or the material forming the gate layers 124 may also be deposited on exposed radial surfaces of the insulating layers 112 that face the trenches 128 and/or the substrate 107. The protruding radial edges of the gate layers 124 and/or the extra deposited gate material are etched, for example, using a selective wet etching or dry etching process (e.g., RIE, DRIE, etc.) until any gate material deposited on the radial surfaces of the insulating layers 112 and/or the substrate 107, and radial edges of the gate layers 124 facing the trenches 128 are substantially axially aligned with corresponding radial edges of the insulating layers 112.

At operation 630, a memory layer is formed in each of plurality of trenches on exposed radial surfaces of the insulating layers and the gate layers located in the first trenches, such that the memory layer extends from the device portion to the interface portions in the first direction. At operation 632, a channel layer structure is formed within each of the plurality of trenches on exposed radial surfaces of the memory layer such that the channel layer structure also extends from the device portion to the interface portions in the first direction. At operation 634, an insulation layer is formed within each of the plurality of trenches by filling each of the plurality of trenches with an insulating material such that a plurality of first device segments that include the memory layer, the channel layer structure, and the insulation layer are formed in the semiconductor die, and extend in the first direction parallel to each other.

Figure 23:
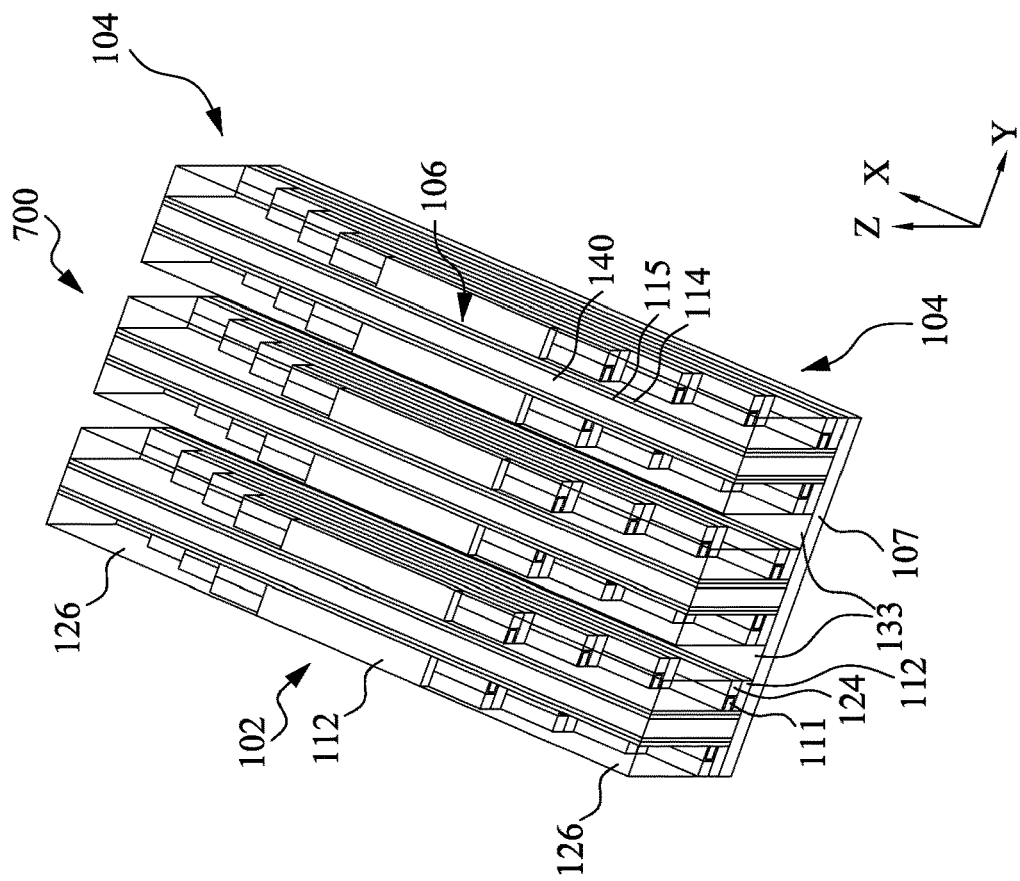

Corresponding to operations 630-634, FIG. 23 is a top, perspective view of the semiconductor die 700 after formation of the memory layer 114, a channel layer structure 115, and an insulation layer 140. The memory layer 114 may include a ferroelectric material, for example, lead zirconate titanate (PZT), PbZr/TiO$_3$, BaTiO$_3$, PbTiO$_2$, etc. The memory layer 114 may be formed using physical vapor deposition (PVD), chemical vapor deposition (CVD), low pressure chemical vapor deposition (LPCVD), plasma enhanced CVD (PECVD), atomic layer deposition (ALD), MBE, any other suitable process or a combination thereof. A conformal coating may be deposited such that the memory layer 114 is continuous on the walls of the trenches 128.

The channel layer structure 115 is formed on a radially inner surface of the memory layer 114 in the Y-direction. In some embodiments, the channel layer structure 115 may be formed from a semiconductor material, for example, Si (e.g., polysilicon or amorphous silicon), Ge, SiGe, silicon carbide (SiC), etc. The channel layer structure 115 may be formed using physical vapor deposition (PVD), chemical vapor deposition (CVD), low pressure chemical vapor deposition (LPCVD), plasma enhanced CVD (PECVD), atomic layer deposition (ALD), MBE, any other suitable process or a combination thereof. A conformal coating may be deposited such that the channel layer structure 115 is continuous on the radially inner surface of the memory layer 114. Each of the trenches 128 is then filled with an insulating material (e.g., SiO, SiN, SiON, SiCN, SiC, SiOC, SiOCN, the like, or combinations thereof) so as to form the insulation layer 140. In some embodiments, the insulation layer 140 may be formed from the same material as the plurality of insulating layers 112 (e.g., SiO$_2$). The insulation layer 140 may be formed using physical vapor deposition (PVD), chemical vapor deposition (CVD), low pressure chemical vapor deposition (LPCVD), plasma enhanced CVD (PECVD), atomic layer deposition (ALD), MBE, any other suitable process or a combination thereof, a high aspect ratio process (HARP), another applicable process, or combinations thereof. Thus, a plurality of first device segments 106 that include the memory layer 114, the channel layer structure 115, and the insulation layer 140 are formed in the semiconductor die 700, and extend in the X-direction parallel to each other from the device portion 102 to the interface portions 104.

Figure 24:
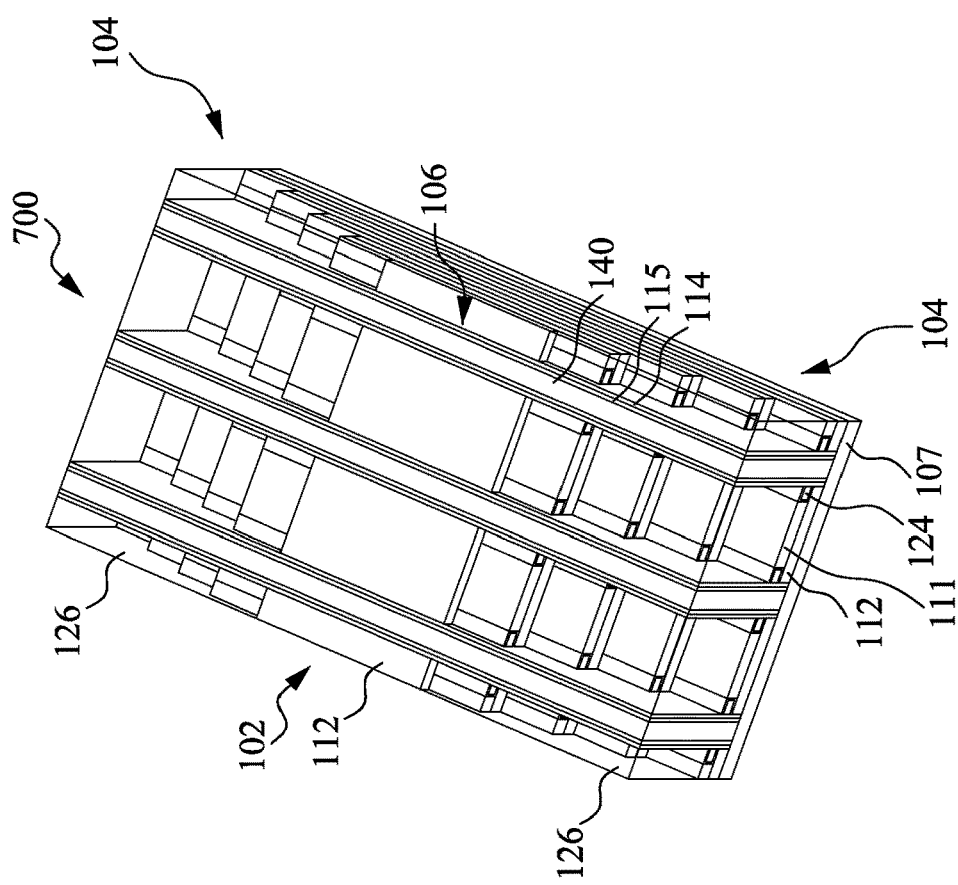

At operation 636 a plurality of second trenches are formed between each of the first device segments such that the plurality of second trenches also extend in the first direction from the device portion to the interface portions parallel to the first device segments. Corresponding to operation 636, FIG. 24 is a top, perspective view of the semiconductor die 700 after forming a plurality of second trenches 133 between each of the first device segments 106 such that the plurality of second trenches also extend in the X-direction from the device portion 102 to the interface portions 104 parallel to the first device segments 106. As with the first trenches 128, the second trenches 133 are formed by etching the stack 108 as well as the ILD in the Z-direction up to the substrate 107.

The plurality of second trenches 133 may be formed using the same process used to form the first plurality of trenches 128. For example, the second trenches 133 may be formed, for example, by depositing a photoresist or other masking layer on a top surface of the semiconductor die 700, i.e., the top surface of the topmost insulating layer 112 of the stack 108 and a top surface of the ILD 126, and a pattern corresponding to the second trenches 133 defined in the masking layer (e.g., via photolithography, e-beam lithography, or any other suitable lithographic process). In other embodiments, a hard mask may be used. Subsequently, the device portion 102 and the interface portions 104 may be etched using a plasma etching process (including radical plasma etching, remote plasma etching, and other suitable plasma etching processes, RIE, DRIE), gas sources such as Cl$_2$, HBr, CF$_4$, CHF$_3$, CH$_2$F$_2$, CH$_3$F, C$_4$F$_6$, BCl$_3$, SF$_6$, H$_2$, NF$_3$, and other suitable etch gas sources and combinations thereof can be used with passivation gases such as N$_2$, O$_2$, CO$_2$, SO$_2$, CO, CH$_4$, SiCl$_4$, and other suitable passivation gases and combinations thereof. Moreover, for the plasma etching process, the gas sources and/or the passivation gases can be diluted with gases such as Ar, He, Ne, and other suitable dilutive gases and combinations thereof to form the second trenches 133. As a non-limiting example, a source power of 10 Watts to 3,000 Watts, a bias power of 0 watts to 3,000 watts, a pressure of 1 millitorr to 5 torr, and an etch gas flow of 0 sccm to 5,000 sccm may be used in the etching process. However, it is noted that source powers, bias powers, pressures, and flow rates outside of these ranges are also contemplated. As shown in FIG. 24, the etch used to form the plurality of second trenches 133 etches through each of the sacrificial layers 111 and insulating layers 112 of the stack 108 such that each of the plurality of second trenches 133 extend form the topmost insulating layer 112 through the bottommost insulating layer 112 to the substrate 107.

Figure 25:
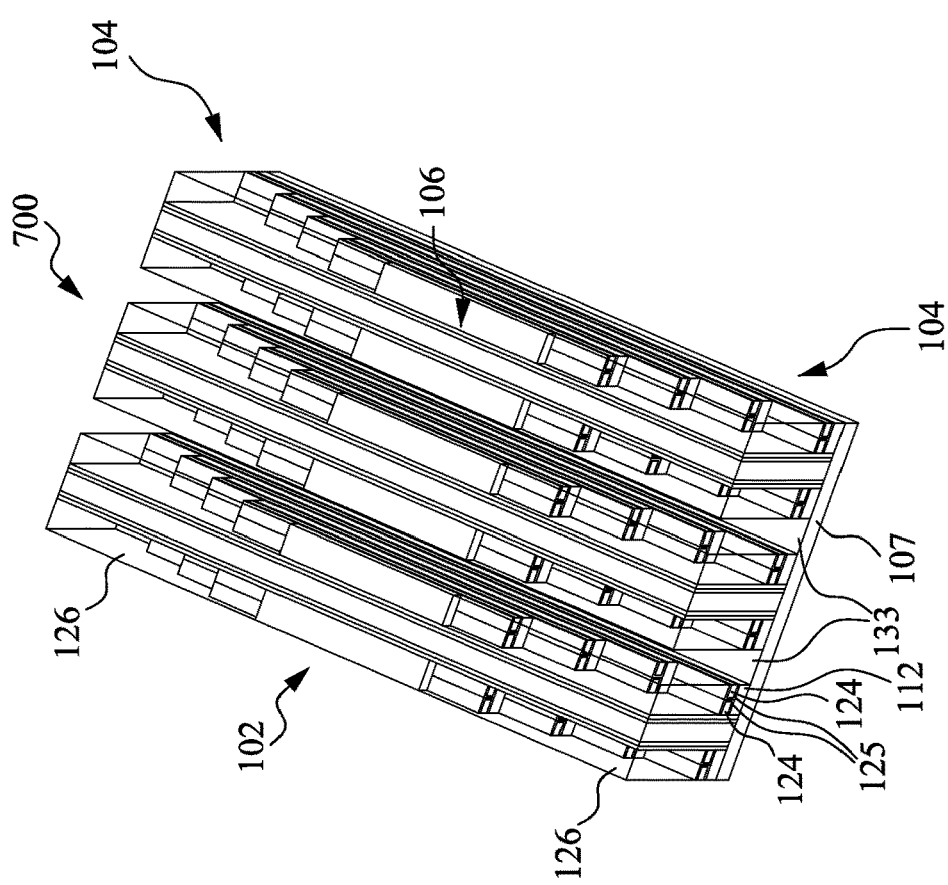

At operation 638, the remaining portions of the sacrificial layers are removed so as to form cavities between the insulating layers adjacent to the previously formed gate layer. At operation 642, operations 624 to 628 are repeated to form a second set of adhesive layers and gate layers adjacent to the previously formed gate layers. Corresponding to operations 638-640, FIG. 25 is a top, perspective view of the semiconductor die 700 after forming a second set of gate layers 124 adjacent to the previously formed gate layers 124. The remaining portions of the sacrificial layers 111 may be etched using the same process as described with respect to operation 622, by etching exposed portions of the sacrificial layers 111 in the second set of trenches 133 until the sacrificial layers 111 are completely removed. This leaves cavities between adjacent layers of insulating layers 112, and adjacent to the gate layers. Adhesive layer 125 is deposited on walls of the newly formed cavities, as described with respect to operation 624. Next, a gate layer material is deposited in the cavities so as to fill the cavities to form a second set of gate layers 124 adjacent to the previously formed gate layers 124, as described with respect to operation 626, such that the two gate layers abut each other with the adhesive layer disposed therebetween (e.g., as shown in the cross-section view of FIG. 5). The second set of gate layers 124 may be etched back, as described with respect to operation 628, such that radial edges of the second set of gate layers 124 facing the second trenches 133 are substantially axially aligned with corresponding radial edges of the insulating layers 112.

Figure 26:
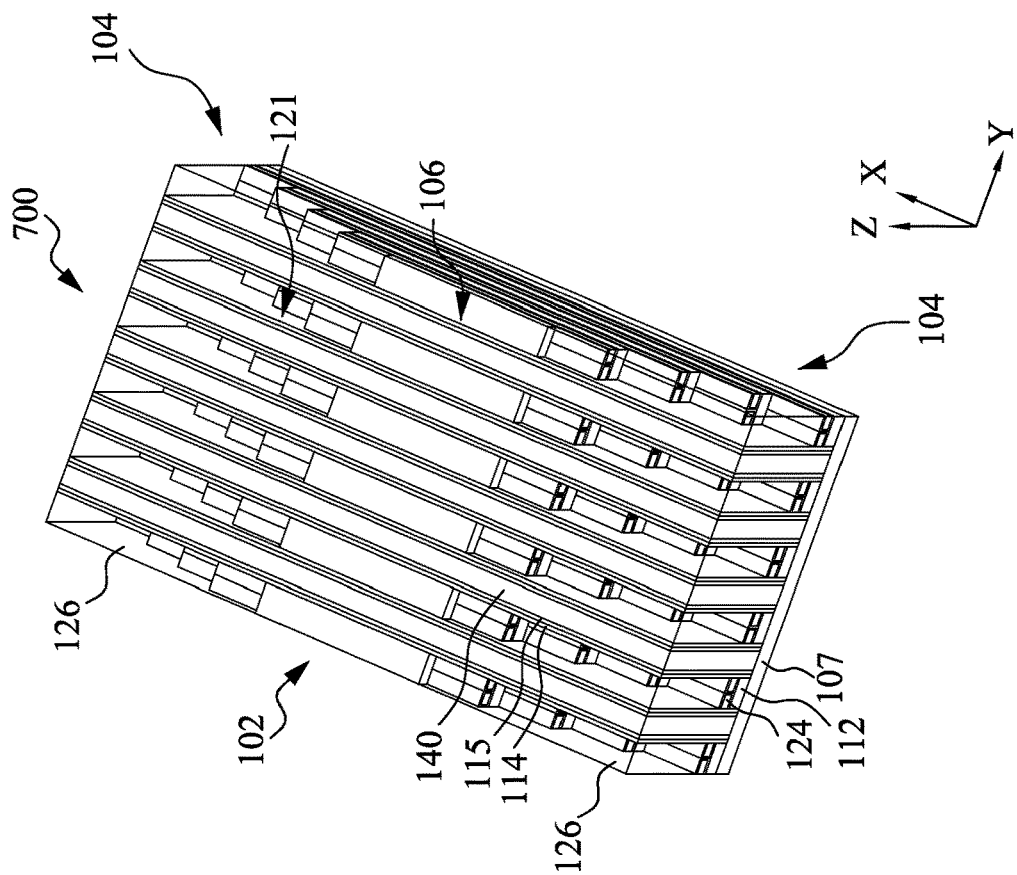

At operation 642, operations 630-634, as previously described herein, are repeated to form a plurality of second device segments in the second trenches. Corresponding to operation 642, FIG. 26 is a top, perspective view of the semiconductor die 700 showing the second device segments 121 formed between the first device segments 106. Each of the second device segments 121 is similar in structure to the first device segments 106 and include the memory layer 114, the channel layer structure 115, and the insulation layer 140. The second device segments 121 extend in the X-direction parallel to each other with a first device segment 106 interposed between a pair of second device segments 121. Forming the first and second device segments 106, 121 allows adjacent insulating layers 112 in the stack 108 to always be supported by either the sacrificial layers 111 during formation of the gate layers 124 included in the first device segment 106, or supported by the gate layer 124 of the first device segment 106 during formation of the second device segment 121, while allowing increase in a device packing density of the semiconductor die 700.

Figure 27:
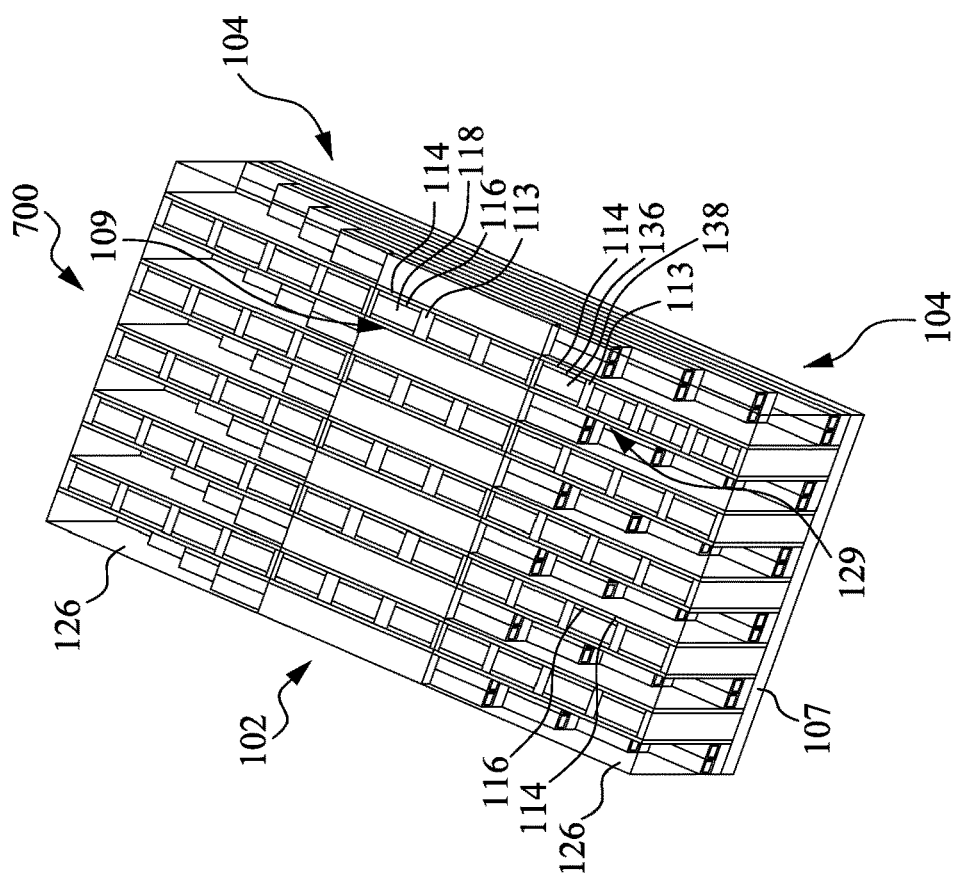

At operation 644 a plurality of active device structures are formed in the device portion and a plurality of dummy device structures are formed in the interface portions, each of the active device structures and the dummy device structures being separated by a plurality of isolation structures. Corresponding to operation 644, FIG. 27 is a top, perspective view of the semiconductor die 700 after formation of a plurality of active device structures 109 located in the device portion 102, and a plurality of dummy device structures 129 located in the interface portions 104. Each of the active and dummy device structures 109, 129 located in each row are separated by isolation structures 113 formed from an insulating material (e.g., the same material used to form the insulating layers 112 or the insulation layer 140 such as $SiO_2$).

To form the active device structures 109 and the dummy device structures 129, a plurality of cavities are etched through the channel layer structure 115 and the insulation layer 140 at predetermined space intervals. The cavities may be etched using a plasma etching process (including radical plasma etching, remote plasma etching, and other suitable plasma etching processes, RIE, DRIE), gas sources such as $Cl_2$, HBr, $CF_4$, $CHF_3$, $CH_2F_2$, $CH_3F$, $C_4F_6$, $BCl_3$, $SF_6$, $H_2$, $NF_3$, and other suitable etch gas sources and combinations thereof can be used with passivation gases such as $N_2$, $O_2$, $CO_2$, $SO_2$, CO, $CH_4$, $SiCl_4$, and other suitable passivation gases and combinations thereof. Moreover, for the plasma etching process, the gas sources and/or the passivation gases can be diluted with gases such as Ar, He, Ne, and other suitable dilutive gases and combinations thereof to form the cavities. As a non-limiting example, a source power of 10 Watts to 3,000 Watts, a bias power of 0 watts to 3,000 watts, a pressure of 1 millitorr to 5 torr, and an etch gas flow of 0 sccm to 5,000 sccm may be used in the etching process. However, it is noted that source powers, bias powers, pressures, and flow rates outside of these ranges are also contemplated.

The etched cavities are then filled with an insulating material (e.g., $SiO_2$) to form the isolation structures 113. The insulating material may be formed using physical vapor deposition (PVD), chemical vapor deposition (CVD), low pressure chemical vapor deposition (LPCVD), plasma enhanced CVD (PECVD), atomic layer deposition (ALD), MBE, any other suitable process or a combination thereof, a high aspect ratio process (HARP), another applicable process, or combinations thereof. Etching the channel layer structure 115 and the insulation layer 140 to form the isolation structures 113 separates the channel layer structure 115 into portions such that a channel layer 116 is included in each active device structure 109, and a dummy channel layer 136 is included in each dummy device structure 129. In some embodiments, a width of the isolation structures 113 located in the device portion 102 may be about equal to a width of the isolation structures 113 located in the interface portions 104. In other embodiments, the width of the isolation structures 113 located in the device portion 102 may be the large than the width of the isolation structures 113 located in the interface portions 104.

Thus, as shown in each FIG. 27, each active device structure 109 includes an inner spacer 118 formed from a portion of the insulation layer 140 extending between adjacent isolation structures 113 in the X-direction located in the device portion 102. The channel layer 116 is disposed on radially outer surfaces of the inner spacer 118 in the Y-direction, and the memory layer 114 is disposed on radially outer surfaces of the channel layer 116 in the Y-direction. One or more gate layers 124 are in contact with radially outer surfaces of the memory layer 114, as previously described herein The dummy device structures 129 are structurally similar to the active device structures 109 and include a dummy inner spacer 138 formed from portions of the insulation layer 140 located in the interface portions 104 extending between adjacent isolation structures 113 located in the X-direction located in the interface portions 104. A dummy channel layer 136 is disposed on radially outer surfaces of the dummy inner spacer 138 in the Y-direction, and the memory layer 114 is disposed on radially outer surfaces of the dummy channel layer 136 in the Y-direction. One or more gate layers 124 are in contact with radially outer surfaces of the memory layer 114, as previously described herein. Each memory layer 114 and each gate layer 124 are continuous from the device portion 102 to the interface portions 104 such that each memory layer 114 and at least one gate layer 124 (e.g., the bottommost gate layer 124 that is most proximate to the substrate 107) are shared by each active device structure 109 and each dummy device structure 129 in a particular row of active and dummy device structures 109, 129.

Figure 28:
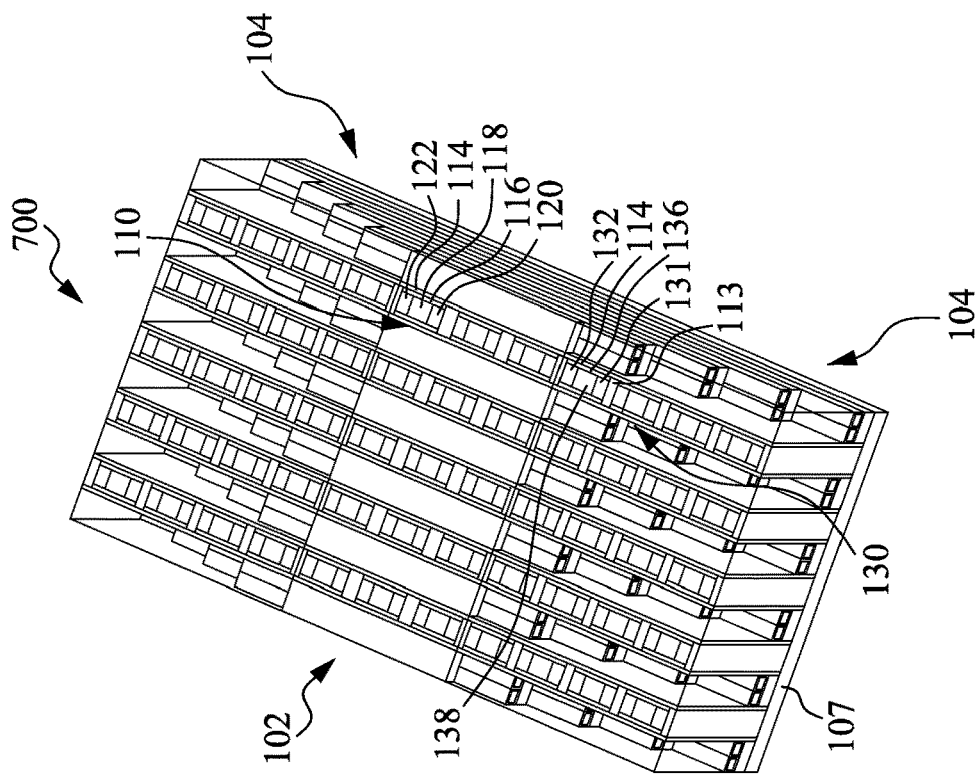

At operation 646, a source and drain are formed through the inner spacer on opposite axial ends of the inner spacers of the inner spacer to form active memory devices, and first and second interface vias are formed through the dummy inner spacers on opposite axial ends of the dummy inner spacers to form the dummy memory devices. Corresponding to operation 646, FIG. 28 is a top, perspective view of the semiconductor die 700 after formation of the source 120 and drain 122 to form the active memory devices 110 in the device portion 102, and forming the first and second interface vias 131, 132 to form the dummy memory devices 130 in the interface portions 104. The source and drain 120, 122, and the interface vias 131, 132.

The source 120, the drain 122, and the interface vias 131, 132 may be formed by first etching through axial ends of the inner spacers 118 and the dummy inner spacers 138, respectively to the substrate 107. The axial ends of the inner spacer 118, and the dummy inner spacers 138 may be etched using a plasma etching process (including radical plasma etching, remote plasma etching, and other suitable plasma etching processes, RIE, DRIE), gas sources such as $Cl_2$, HBr, $CF_4$, $CHF_3$, $CH_2F_2$, $CH_3F$, $C_4F_6$, $BCl_3$, $SF_6$, $H_2$, $NF_3$, and other suitable etch gas sources and combinations thereof can be used with passivation gases such as $N_2$, $O_2$, $CO_2$, $SO_2$, CO, $CH_4$, $SiCl_4$, and other suitable passivation gases and combinations thereof. Moreover, for the plasma etching process, the gas sources and/or the passivation gases can be diluted with gases such as Ar, He, Ne, and other suitable dilutive gases and combinations thereof. As a non-limiting example, a source power of 10 Watts to 3,000 Watts, a bias power of 0 watts to 3,000 watts, a pressure of 1 millitorr to 5 torr, and an etch gas flow of 0 sccm to 5,000 sccm may be used in the etching process. However, it is noted that source powers, bias powers, pressures, and flow rates outside of these ranges are also contemplated.

Next, the source 120, the drain 122, and the interface vias 131, 132 may be formed, for example, using an epitaxial layer growth process such that the source 120, the drain 122 are located on opposite axial ends of the inner spacer 118, and the interface vias 131, 132 are located at opposite axial ends of the dummy inner spacer 138, each extending from the substrate 107 to a top surface of the inner spacer 118 and the dummy inner spacers 138, respectively. In some embodiments, a control deposition step may be performed for forming the source 120, the drain 122, and the interface vias 131, 132 such that the deposition step is stopped when a height of the source 120, the drain 122, and the interface vias 131, 132 in the Z-direction are equal to a height of the stack 108, ad. In other embodiments, a CMP operation may be performed after formation of the source 120, the drain 122, and the interface vias 131, 132 so as to ensure a top surface of each of the topmost insulating layer 112, the memory layer 114, the channel layer 116, the dummy channel layer 136, the inner spacer 118, the dummy inner spacer 138, the source 120, the drain 122, and the interface vias 131, 132 lie in the same X-Y plane or are level with a top surface of the topmost insulating layer 112. In still other embodiments, a top surface of the source 120, the drain 122, and the interface vias 131, 132 may be higher than a top surface of the topmost insulating layer 112. In some other embodiments, the top surface of the source 120, the drain 122, and the interface vias 131, 132 may be lower than the top surface of the topmost insulating layer 112.

In-situ doping (ISD) may be applied to form doped source 120, drain 122, and interface vias 131, 132, thereby creating the junctions for each active memory device 110 formed from the active device structures 109. N-type and p-type FETs are formed by implanting different types of dopants to selected regions (e.g., the source 120, the drain 122, and the interface vias 131, 132) of the active device structure 109 to form the junction(s). N-type devices can be formed by implanting arsenic (As) or phosphorous (P), and p-type devices can be formed by implanting boron (B).

The dummy memory devices 130 are structurally similar to the active memory devices 110, but are not used for memory storage. Instead, only the interface vias 131 and 132 are used to provide an electrical interface with an external device (e.g., the external device 10). Previously, semiconductor dies were fabricated by first forming active memory devices, and subsequently interface vias were formed in the interface vias to provide electrical interface with an external device (e.g., the external device 10). In contrast, the dummy memory devices 130, and thereby, the interface vias 131, 132 of the semiconductor die 700 are formed simultaneously with the source/drain 120, 122, which reduces fabrication steps, thereby reducing fabrication costs and complexity.

While FIG. 28 shows dummy memory devices 130 that are structurally similar to the active memory devices 110 and include two interface vias 131, 132, in other embodiments, the dummy memory devices 130 may have a different shape or size from the active memory devices 110, and may have only one interface via (e.g., any of the dummy memory devices shown in FIGS. 6A-9B.

Figure 29:
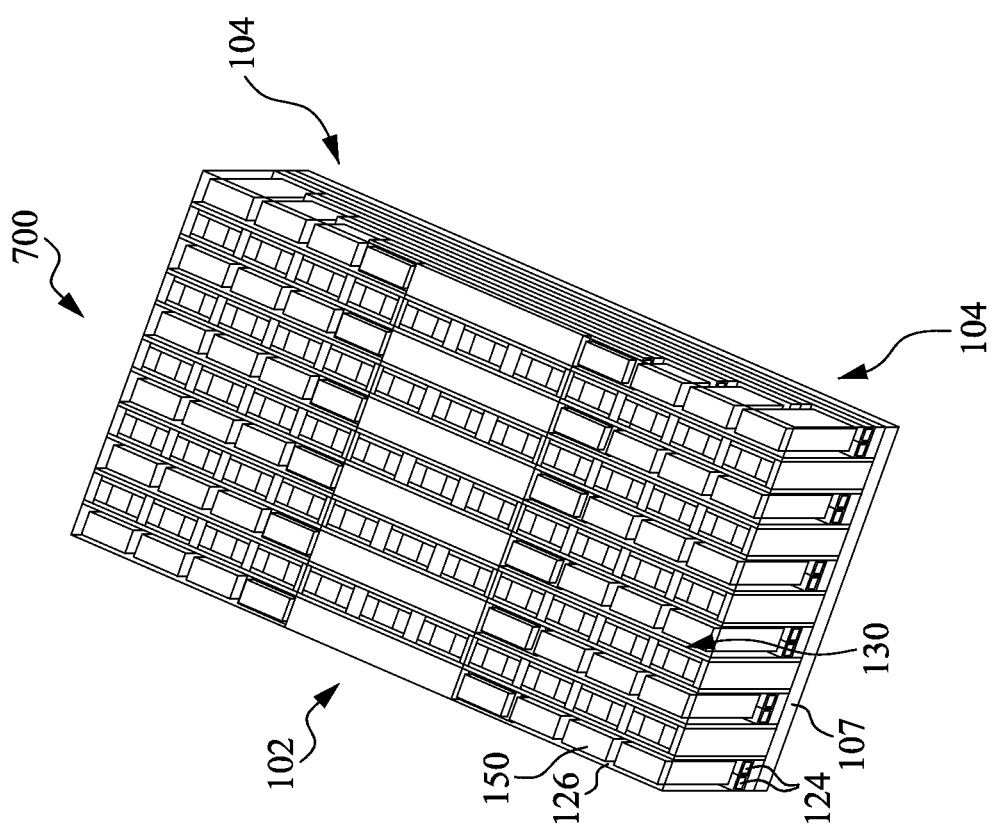

At operation 648, gate vias are formed in the interface portions through the ILD between adjacent dummy device structures in the second direction (e.g., the Y-direction). Corresponding to operation 648, FIG. 29 is a top, perspective view of a semiconductor die 700 after formation of the gate vias 150 through the ILD 126. To form the gate vias 150, an array of cavities may be formed in the ILD 126 to the underlying gate layers 124. The cavities may be formed, for example, using a plasma etching process (including radical plasma etching, remote plasma etching, and other suitable plasma etching processes, RIE, DRIE), gas sources such as $Cl_2$, HBr, $CF_4$, $CHF_3$, $CH_2F_2$, $CH_3F$, $C_4F_6$, $BCl_3$, $SF_6$, $H_2$, $NF_3$, and other suitable etch gas sources and combinations thereof can be used with passivation gases such as $N_2$, $O_2$, $CO_2$, $SO_2$, CO, $CH_4$, $SiCl_4$, and other suitable passivation gases and combinations thereof. Moreover, for the plasma etching process, the gas sources and/or the passivation gases can be diluted with gases such as Ar, He, Ne, and other suitable dilutive gases and combinations thereof. As a non-limiting example, a source power of 10 Watts to 3,000 Watts, a bias power of 0 watts to 3,000 watts, a pressure of 1 millitorr to 5 torr, and an etch gas flow of 0 sccm to 5,000 sccm may be used in the etching process. However, it is noted that source powers, bias powers, pressures, and flow rates outside of these ranges are also contemplated.

The array of cavities are then filled with an electrically conducting material, for example, tungsten (W), copper (Cu), cobalt (Co), etc., or a high-k dielectric material, for example, hafnium oxide (HfO), tantalum nitride (TaN), etc. The electrically conducting material may be deposited using physical vapor deposition (PVD), chemical vapor deposition (CVD), low pressure chemical vapor deposition (LPCVD), plasma enhanced CVD (PECVD), atomic layer deposition (ALD), MBE, any other suitable process or a combination thereof, a high aspect ratio process (HARP), another applicable process, or combinations thereof.

Figure 30:
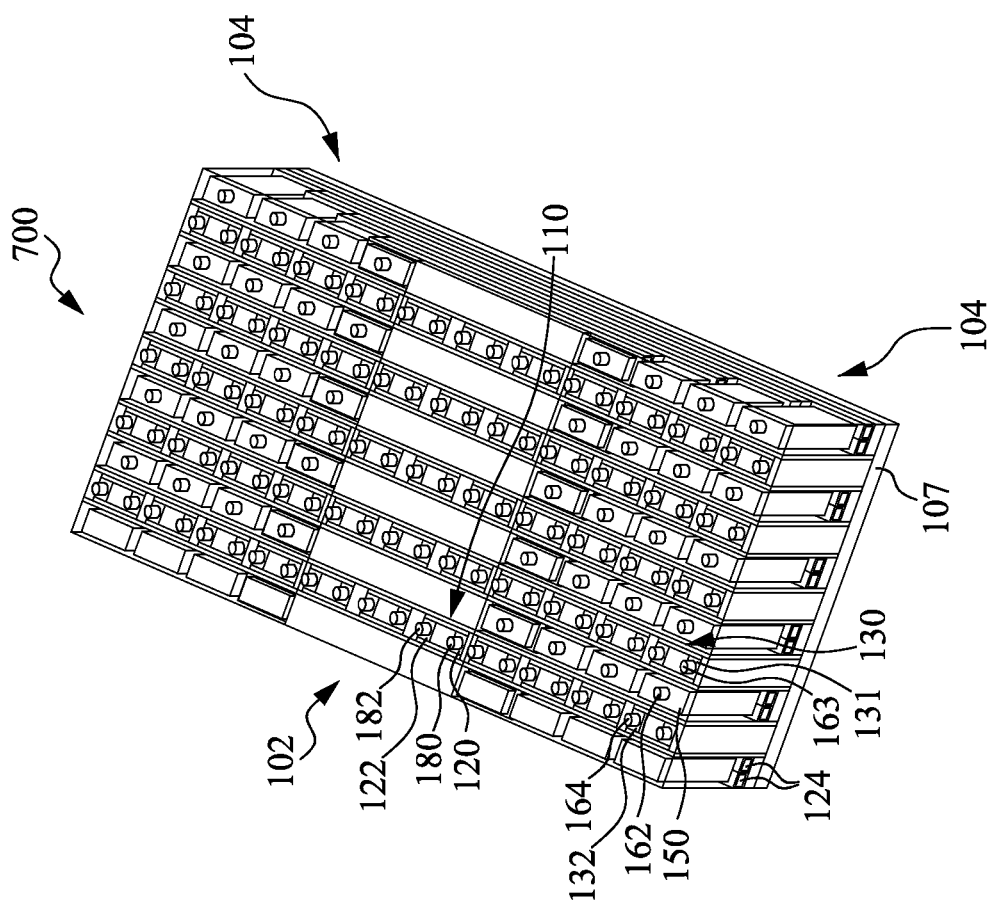

At operation 650, at least one gate through vias are formed in the gate vias and at least one interface through vias are formed in the interface vias. Corresponding to operation 650, FIG. 30 is a top, perspective view of a semiconductor die 700 showing a gate through via 162 formed in the gate via 150, a first interface through via 163 formed in the first interface via 131, and a second interface through via 164 formed in the second interface via 132. A source through via 180 and a drain through via 182 may also be formed in the source 120 and drain 122 respectively, of each of the active memory devices 110 simultaneously with the gate through vias 162, and the interface through vias 163, 164.

In some embodiments, the gate through via 162 and the interface through vias 163, 164 may be disposed at least partially through the gate vias 150, and the interface vias 131, 132, respectively. The gate through vias 162 and the interface through vias 163, 164 may be formed from a conducting material, for example, tungsten (W), copper (Cu), cobalt (Co), etc. In some embodiments, the gate through vias 162 and the interface through vias 163, 164 may be formed using a dual damascene process. For example, a cavity may be formed in the gate vias 150 and the interface vias 131, 132. In some embodiments, a spacer layer may deposited on a top surface of the semiconductor die 700 (e.g., a top surface of the topmost insulating layer 112 and the ILD 126) and throughholes formed in the spacer layer at locations corresponding to the gate vias 150, the interface vias 131, 132, and the source/drain 120, 122. In such embodiments, cavities may not be formed in the gate vias 150 and/or the interface vias 131, 132.

In some embodiments, a diffusion barrier (e.g., a Ta based material) may be deposited in each of the cavities, and a thin metal (e.g., Cu) seed layer is deposited on the diffusion barrier (e.g., using PVD, CVD, MBOE, ALD, etc.). This is followed by electroplating of the metal (e.g., Cu) on the metal seed layer until the metal fills the trenches and projects axially upwards of the ILD 126. This process can be repeated until gate through vias 162, and interface through vias 163, 164 having a desired height are obtained. The sacrificial layer may be removed before or after forming the various through vias, or after forming the through via caps, or be left disposed on the top surface of the semiconductor die 700.

Figure 31:
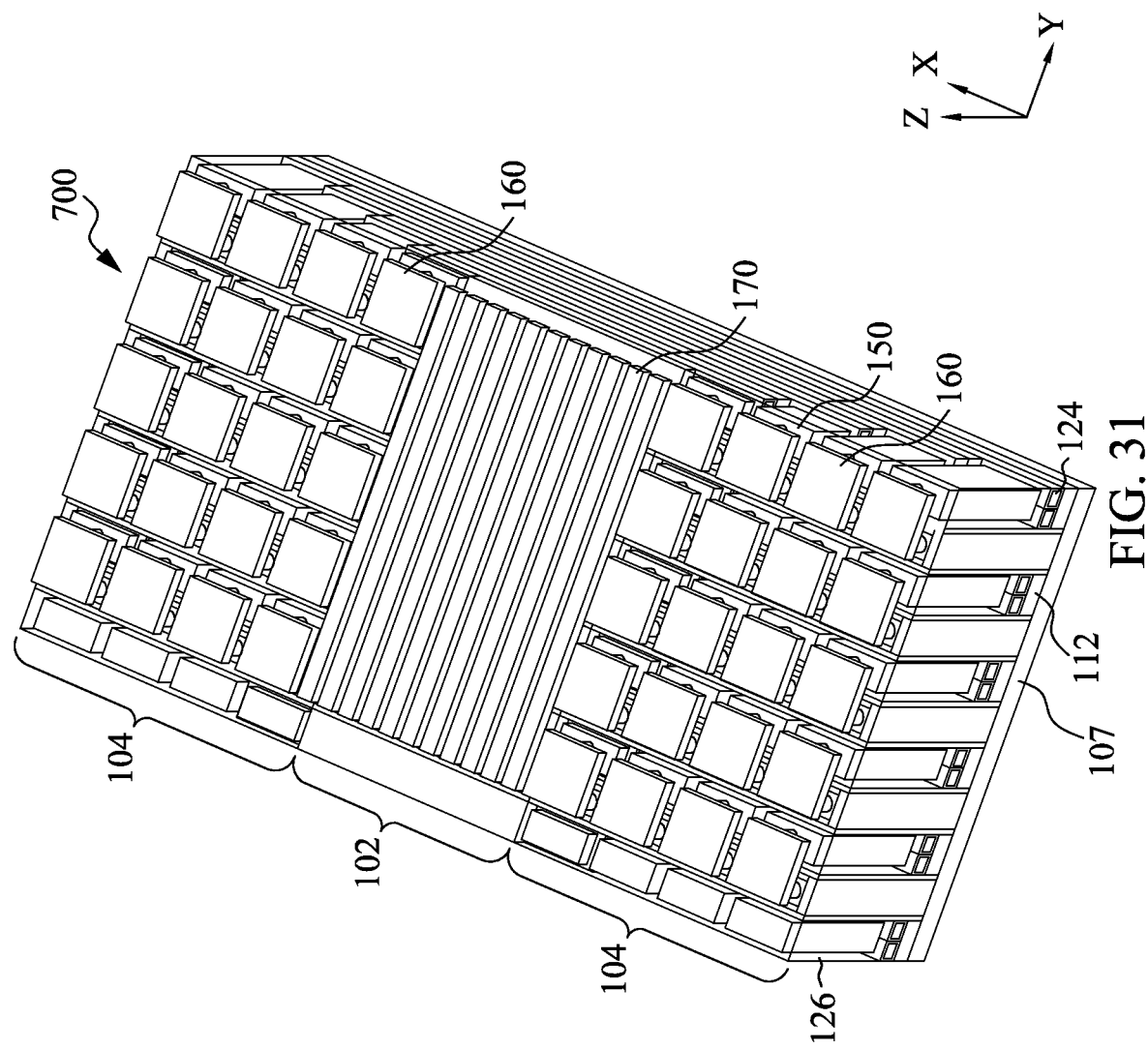

At operation 652 a plurality of through via caps are formed that couple a gate through via of a gate via to the interface through via/s of an adjacent interface via in the second direction (e.g., the Y-direction). Moreover, driver lines may also be formed that couple source/drain through vias of source/drains of the active device structures located parallel to each other in the second direction (e.g., the Y-direction), resulting in the final semiconductor die. Corresponding to operations 652, FIG. 31 is a top, perspective view of the semiconductor die 700 after forming the through caps 160 and the driver lines 170. Each through via cap 160 is coupled to a gate through via 162, and the corresponding interface through vias 163, 164 of a dummy memory device 130 located parallel to the gate via 150 in the Y-direction, and each driver line 170 is coupled to source/drain through vias 181, 182, respectively of each of the active memory devices 110 located parallel to each other in the Y-direction.

The through via caps 160 and the driver lines 170 may be formed from a conducting material, for example, tungsten (W), copper (Cu), cobalt (Co), etc. The through via caps 160 and the driver lines 170 may also be formed using a dual damascene process, for example, after formation of the through vias 162, 163, 164, 180, 182 before removing the spacer layer. While the semiconductor die 700 is shown without the spacer layer, in some embodiments, the spacer layer may remain included in the final semiconductor die 700. As shown in FIG. 5, the through via cap 160 electrically couples the interface vias 131, 132 of a dummy memory device 130, to a gate via 150 located parallel to the dummy memory device 130 in the Y-direction and thereby, to the gate layers 124 that coupled to the respective gate via 150. In this manner, a gate activation signal may be transmitted from the external device 10 via interface vias 131 and/or 132, a through via cap 160, and the gate via 150 to a corresponding gate layer 124. Moreover, the driver lines 170 may be used to communicate an electrical signal (e.g., a current or voltage) to a corresponding source 120 or receive an electrical signal (e.g., a current or voltage) from a corresponding drain 122, when the gate layer 124 is activated.

In some embodiments, a semiconductor die may be formed such that the gate vias may be formed simultaneously with the source, drain, and interface vias such that the gate vias are formed from the same material as the source, drain, and interface vias. For example, FIG. 32A is a top, perspective view of a semiconductor die 800, and FIG. 32B is a top view of a portion of the semiconductor die 800 indicated by the arrow C in FIG. 32A. The semiconductor die 800 is substantially similar to the semiconductor die 100 and 700, and includes a device portion 802 and interface portions 804 located at axial ends of the device portions 802 in the X-direction. An array of the active memory devices 110 is located in the device portion 802, and an array of dummy memory devices 130 is located in the interface portions 804, as previously described herein with respect to the semiconductor die 100, 700.

However, different from the semiconductor die 100, 700, the semiconductor die 800 includes an array of gate vias 850 located in the interface portions 804 between adjacent rows of dummy memory devices 130. The gate vias 850 are formed from simultaneously with, and using the same material as the interface vias 131, 132, and the source 120 and drain 122. For example, referring to FIGS. 10A-10C, the operation 646 is combined with operation 644 obviating the use of fabrication steps to separately form the gate vias thereby, reducing fabrication complexity and cost.

For example, the source 120, the drain 122, the interface vias 131, 132, and the gate vias may be formed by first etching through axial ends of the inner spacers 118, and the dummy inner spacers 138 to the substrate 107, and simultaneously etching the ILD 126 to the gate layers 124 at locations where the gate vias 850 are to be formed. The axial ends of the inner spacer 118 and the dummy inner spacers 138, and the ILD 126 may be etched using a plasma etching process (including radical plasma etching, remote plasma etching, and other suitable plasma etching processes, RIE, DRIE), gas sources such as $Cl_2$, HBr, $CF_4$, $CHF_3$, $CH_2F_2$, $CH_3F$, $C_4F_6$, $BCl_3$, $SF_6$, $H_2$, $NF_3$, and other suitable etch gas sources and combinations thereof can be used with passivation gases such as $N_2$, $O_2$, $CO_2$, $SO_2$, CO, $CH_4$, $SiCl_4$, and other suitable passivation gases and combinations thereof. Moreover, for the plasma etching process, the gas sources and/or the passivation gases can be diluted with gases such as Ar, He, Ne, and other suitable dilutive gases and combinations thereof. As a non-limiting example, a source power of 10 Watts to 3,000 Watts, a bias power of 0 watts to 3,000 watts, a pressure of 1 millitorr to 5 torr, and an etch gas flow of 0 sccm to 5,000 sccm may be used in the etching process. However, it is noted that source powers, bias powers, pressures, and flow rates outside of these ranges are also contemplated.

Next, the source 120, the drain 122, the interface vias 131, 132, and the gate vias 850 may be formed, for example, using an epitaxial layer growth process such that the source 120 and the drain 122 are located on opposite axial ends of the inner spacer 118, the first interface via 131 and the second interface via 132 are located at opposite axial ends of the dummy inner spacers 138, and gate vias 850 extending from the gate layers 124 to the top surface of the ILD 126 parallel to corresponding dummy memory devices 130. A CMP operation may be performed after formation of the source 120, the drain 122, the interface vias 131, 132, and the gate vias 850 so as to ensure a top surface of each of the topmost insulating layer 112, the memory layer 114, the channel layer 116, the dummy channel layer 136, the inner spacer 118, the dummy inner spacer 138, the source 120, the drain 122, the interface vias 131, 132, and the gate vias 850 lie in the same X-Y plane or are level with a top surface of the topmost insulating layer 112. In still other embodiments, a top surface of the source 120, the drain 122, the interface vias 131, 132, and/or the gate vias 850 may be higher than a top surface of the topmost insulating layer 112. In some other embodiments, the top surface of the source 120, the drain 122, the interface vias 131, 132, and/or the gate vias 850 may be lower than the top surface of the topmost insulating layer 112.

In some embodiments, a semiconductor die comprise a device portion, comprising: an array of active memory devices, each row of the array of active memory devices extending in a first direction. At least one interface portion located adjacent to an axial end of the device portion in the first direction, the at least one interface portion having a staircase profile in a vertical direction, the at least one interface portion comprising: an array of dummy memory devices, each row of the array of dummy memory devices axially aligned with a corresponding row of the array of active memory devices in the first direction, each dummy memory device comprising at least one interface via, and an array of gate vias, each row of the array of gate vias extending in the first direction and located parallel to a row of the array of dummy memory devices in a second direction perpendicular to the first direction, each gate via being electrically coupled to the at least one interface via of a dummy memory device located adjacent thereto.

In some embodiments, a semiconductor devices comprises a device portion comprises an array of active memory devices, each row of the array of active memory devices extending in a first direction. Each active memory device comprises: a source and a drain spaced apart from the source in the first direction. A channel layer is disposed on radially outer surfaces of the source and the drain, the channel layers extending in the first direction. A memory layer is disposed on a radially outer surface of the channel layer and extends in the first direction. A stack is disposed on outer surfaces of the memory layer and extends in the first direction, the stack comprising a plurality of insulating layers and a plurality of gate layers alternatively stacked on top each other. At least one interface portion is located adjacent to an axial end of the device portion in the first direction, the at least one interface portion having a staircase profile in a vertical direction. The at least one interface portion comprises: an array of dummy memory devices, each row of the array of dummy memory devices axially aligned with a corresponding row of the array of active memory devices in the first direction. The memory layer extends from the device portion to the at least one interface portion along the respective row of active memory devices to a corresponding row of the array of dummy memory devices, the memory layer being continuous from the device portion to the at least one interface portion.

In some embodiments, a method of fabricating a semiconductor die, comprises: providing a stack comprising a plurality of insulating layers and a plurality of sacrificial layers alternatively stacked on top of each other. Interface portions are formed on axial ends of the stack in a first direction such that the stack forms a device portion interposed between the interface portions, the interface portions having a staircase profile in a vertical direction. An interlayer dielectric is deposited on the interface portion. A plurality of trenches are formed extending through the stack in the first direction, the plurality of trenches extending through the device portion and the interface portion. An array of active memory devices are formed in the device portion and an array of dummy memory devices in the interface portions. Each row of the array of active memory devices and a corresponding row of the array of dummy memory devices comprises a memory layer extending from the device portion to the at least one interface portion along the respective row of active memory devices to the corresponding row of the array of dummy memory devices, the memory layer being continuous from the device portion to the at least one interface portion.

As used herein, the terms "about" and "approximately" generally mean plus or minus 10% of the stated value. For example, about 0.5 would include 0.45 and 0.55, about 10 would include 9 to 11, about 1000 would include 900 to 1100.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor die, comprising:
    a device portion, comprising:
        an array of active memory devices, each row of the array of active memory devices extending in a first direction; and
    at least one interface portion located adjacent to an axial end of the device portion in the first direction, the at least one interface portion having a staircase profile in a vertical direction, the at least one interface portion comprising:
        an array of gate vias, each row of the array of gate vias extending in the first direction and located parallel to a row of an array of dummy memory devices in a second direction perpendicular to the first direction, each gate via being electrically coupled to one or more interface vias of a corresponding one of the dummy memory devices located adjacent thereto.

2. The semiconductor die of claim 1, wherein the one or more interface vias are each configured to be electrically coupled to an external device.

3. The semiconductor die of claim 1, wherein the one or more interface vias and the gate vias are formed from the same material.

4. The semiconductor die of claim 1, wherein each of the active memory device comprises:
    a source;
    a drain spaced apart from the source in the first direction;
    an inner spacer extending between the source and the drain;
    a channel layer disposed on radially outer surfaces of the source, the drain, and the inner spacer, the radially outer surfaces extending in the first direction;
    a memory layer disposed on a radially outer surface of the channel layer and extending in the first direction, the memory layer extending from the device portion to the at least one interface portion along the respective row of active memory devices, the memory layer being continuous from the device portion to the at least one interface portion; and
    a stack disposed on an outer surface of the memory layer and extending in the first direction, the stack comprising a plurality of insulating layers and a plurality of gate layers alternatively stacked on top each other.

5. The semiconductor die of claim 4, wherein:
    each of the plurality of gate layers extend from the device portion to the at least one interface portion along the respective row of active memory devices, each of the plurality of gate layers being continuous from the device portion to the at least one interface portion, and the gate via is electrically coupled to a corresponding gate layer.

6. The semiconductor die of claim 4, wherein each of the dummy memory devices further comprises:
   a dummy channel layer disposed on radially outer surfaces of the one or more interface vias; and
   the memory layer of a corresponding row of the active memory devices disposed on a radially outer surface of the dummy channel layer.

7. The semiconductor die of claim 6, further comprising:
   at least one gate through via coupled to each gate via of the array of gate vias;
   at least one interface through via coupled to each interface via of the array of dummy memory devices; and
   a through via cap coupled to the at least one gate through via of a gate via and the one or more interface vias of the corresponding dummy memory device located adjacent to the respective gate via.

8. The semiconductor die of claim 7, wherein:
   each dummy memory device comprises:
     a first interface via,
     a second interface via spaced apart from first interface via in the first direction, and
     a dummy inner spacer extending between the first interface via and the second interface via; and
   the semiconductor die further comprises:
     at least one gate through via coupled to the gate via,
     a first interface through via coupled to the first interface via, and
     a second interface through via coupled to the second interface via.

9. The semiconductor die of claim 1, wherein:
   each dummy memory device comprises an interface via having a first width, and
   the gate via has a second width that is approximately equal to the first width.

10. The semiconductor die of claim 1, wherein:
    each dummy memory device comprises an interface via having a first width, and
    the gate via has a second width that is larger than the first width.

11. The semiconductor die of claim 1, wherein:
    each dummy memory device comprises an interface via having a first width, and
    the gate via has a second width that is smaller than the first width.

12. The semiconductor die of claim 1, wherein each gate via is axially offset in the first direction from a corresponding interface via to which the gate via is coupled.

13. A semiconductor die, comprising:
    an array of first memory devices, each row of the array of first memory devices extending in a first direction;
    an array of second memory devices located adjacent to an axial end of the array of first memory devices in the first direction, each second memory device comprising one or more interface vias; and
    an array of gate vias, each row of the array of gate vias extending in the first direction and located parallel to a row of the array of second memory devices in a second direction perpendicular to the first direction;
    wherein each of the gate vias is electrically coupled to the one or more interface vias of a corresponding one of the second memory devices located adjacent thereto.

14. The semiconductor die of claim 13, wherein the one or more interface vias and the gate vias are formed from the same material.

15. The semiconductor die of claim 13, further comprising a plurality of through via caps disposed above the array of second memory devices and the array of gate vias.

16. The semiconductor die of claim 15, wherein each of the through via caps is configured to electrically couple one of the gate vias to corresponding one or more interface vias.

17. The semiconductor die of claim 13, wherein each of the second memory devices further comprises:
    a channel layer extending along radially outer surfaces of the corresponding one or more interface vias; and
    a memory layer extending along a radially outer surface of a dummy channel layer.

18. The semiconductor die of claim 17, wherein the memory layer further extends into the array of first memory devices along the first direction, while the channel layer does not extend into the array of first memory devices.

19. A semiconductor die, comprising:
    an array of first memory devices, each row of the array of first memory devices extending in a first direction;
    an array of second memory devices located adjacent to an axial end of the array of first memory devices in the first direction, each second memory device comprising one or more interface vias; and
    an array of gate vias, each row of the array of gate vias extending in the first direction and located parallel to a row of the array of second memory devices in a second direction perpendicular to the first direction;
    wherein each of the gate vias is electrically coupled to the one or more interface vias of a corresponding one of the second memory devices located adjacent thereto, and
    wherein the one or more interface vias and the gate vias are formed from the same material.

20. The semiconductor die of claim 19, wherein each of the second memory devices further comprises:
    a channel layer extending along radially outer surfaces of the corresponding one or more interface vias; and
    a memory layer extending along a radially outer surface of a dummy channel layer;
    wherein the memory layer further extends into the array of first memory devices along the first direction, while the channel layer does not extend into the array of first memory devices.

* * * * *